US007834671B2

(12) United States Patent
Chen et al.

(10) Patent No.: US 7,834,671 B2
(45) Date of Patent: Nov. 16, 2010

(54) ANALOG BUFFER WITH VOLTAGE COMPENSATION MECHANISM

(75) Inventors: Chung-Chun Chen, Hsin-Chu (TW); Cheng-Chiu Pai, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 174 days.

(21) Appl. No.: 12/137,544

(22) Filed: Jun. 12, 2008

(65) Prior Publication Data

US 2009/0267655 A1 Oct. 29, 2009

(30) Foreign Application Priority Data

Apr. 23, 2008 (TW) .............................. 97114802 A

(51) Int. Cl.
*H03K 3/00* (2006.01)
*H03B 1/00* (2006.01)

(52) U.S. Cl. ...................................... 327/112; 327/108

(58) Field of Classification Search ................. 327/108, 327/112, 111; 326/82, 83, 85–88
See application file for complete search history.

(56) References Cited

U.S. PATENT DOCUMENTS 6,876,235 B2 4/2005 Li
2004/0183772 A1 * 9/2004 Nakajima et al. ........... 345/102

* cited by examiner

*Primary Examiner*—Lincoln Donovan
*Assistant Examiner*—Diana J Cheng
(74) *Attorney, Agent, or Firm*—Winston Hsu; Scott Margo

(57) ABSTRACT

An analog buffer having voltage compensation mechanism is disclosed for use in a source driving circuit of a liquid crystal display. The analog buffer includes a reference voltage generator, a plurality of capacitors, a plurality of switches, and a plurality of transistors. Each of the capacitors is utilized to store the gate-source voltage of the corresponding turn-on transistor for performing gate-source voltage compensation operation based on the reference voltages provided by the reference voltage generator. Each of the switches functions to control gate-source voltage compensation operation and is turned on/off in response to a corresponding control signal. The analog buffer is capable of compensating the gate-source voltages of turn-on transistors for generating an output voltage having an acceptable tiny offset with respect to an input voltage.

25 Claims, 11 Drawing Sheets

ANALOG BUFFER WITH VOLTAGE COMPENSATION MECHANISM

BACKGROUND OF THE INVENTION

1. Field of the Invention

The present invention relates to an analog buffer, and more particularly, to an analog buffer with voltage compensation mechanism.

2. Description of the Related Art

Because liquid crystal display (LCD) devices are characterized by thin appearance, low power consumption, and low radiation, LCD devices have been widely applied in various electronic products for panel displaying. The operation of an LCD device is featured by varying voltage drops between opposite sides of the liquid crystal cells of the LCD device for twisting the angles of the liquid crystal molecules in the liquid crystal cells so that the transparency of the liquid crystal cells can be controlled for illustrating images with the aid of the light source provided by a backlight module.

In general, the LCD device comprises a plurality of pixel units, a plurality of data lines and a source driver. The source driver comprises a plurality of source driving circuits. The source driving circuits perform latching operations, level shifting operations, digital-to-analog converting operations and analog signal buffering operations on the digital image data signals inputted to the LCD device for generating a plurality of analog signals. Each source driving circuit is coupled to a corresponding data line for writing the generated analog signals into corresponding pixel units.

Accordingly, the analog buffer of each source driving circuit for performing the analog signal buffering operation functions as a key element for writing the generated analog signals into corresponding pixel units. With the aid of the analog buffers having enhanced driving ability for performing high-speed and accurate buffering operations, the LCD device is capable of providing high display quality. That is, the display quality of the LCD device is corresponding directly to the performance of the analog buffers. Furthermore, the source driver is installed with lots of analog buffers in that each source driving circuit should be installed with an individual analog buffer, and therefore a significant part of the layout area of the LCD device is required for accommodating the analog buffers. For that reason, simplified designs of the analog buffer and related control circuit without degrading the driving performance are required for realizing advanced low-cost LCD devices having thinner appearance.

FIG. 1 is a schematic diagram showing the circuit of a conventional analog buffer for use in an LCD device. As shown in FIG. 1, the analog buffer 100 comprises an N-type metal-oxide-semiconductor (MOS) transistor 111, a P-type MOS transistor 112, a plurality of capacitors 121-124, a plurality of switches 131-142, and two current sources 181 and 182. The analog buffer 100 is utilized to perform the analog signal buffering operation on an input voltage Vin for generating an output voltage Vout for charging the pixel capacitor Cpixel. However, the aforementioned conventional analog buffer is operated based on a variety of complicated control signals for controlling on/off states of the switches. Also, extra current control signals are required for controlling the current sources of the conventional analog buffer. That is, the circuit operation of the conventional analog buffer should be performed with the aid of complicated control circuits for generating the complicated control signals. In summary, the conventional analog buffer cannot meet the demand for designing advanced low-cost LCD devices having thinner appearance.

SUMMARY OF THE INVENTION

In accordance with an embodiment of the present invention, an analog buffer with voltage compensation mechanism is disclosed. The analog buffer comprises a first transistor, a second transistor, a first capacitor, a second capacitor, a first switch, a second switch, a third switch, a fourth switch, a fifth switch, and a sixth switch.

The first transistor comprises a drain for receiving a first supply voltage, a source for outputting an output voltage, and a gate. The second transistor comprises a drain for receiving a second supply voltage, a source coupled to the source of the first transistor, and a gate. The first capacitor comprises a first end coupled to the gate of the first transistor, and a second end. The second capacitor comprises a first end coupled to the gate of the second transistor, and a second end. The first switch comprises a first end coupled to the second end of the first capacitor, and a second end coupled to the source of the first transistor. The second switch comprises a first end coupled to the second end of the second capacitor, and a second end coupled to the source of the second transistor. The third switch comprises a first end for receiving a first reference voltage, and a second end coupled to the first end of the first capacitor. The fourth switch comprises a first end for receiving a second reference voltage, and a second end coupled to the first end of the second capacitor. The fifth switch comprises a first end for receiving an input voltage, and a second end coupled to the second end of the first capacitor. The sixth switch comprises a first end for receiving the input voltage, and a second end coupled to the second end of the second capacitor. The analog buffer performs a voltage compensation operation for generating the output voltage based on the first reference voltage and the second reference voltage.

In accordance with another embodiment of the present invention, an analog buffer with voltage compensation mechanism is disclosed. The analog buffer comprises a first transistor, a second transistor, a first capacitor, a second capacitor, a first switch, a second switch, a third switch, a fourth switch, a fifth switch, a sixth switch, a third capacitor, a fourth capacitor, a seventh switch, an eighth switch, a ninth switch, and a tenth switch.

The first transistor comprises a drain for receiving a first supply voltage, a source for outputting an output voltage, and a gate. The second transistor comprises a drain for receiving a second supply voltage, a source coupled to the source of the first transistor, and a gate. The first capacitor comprises a first end coupled to the gate of the first transistor, and a second end. The second capacitor comprises a first end coupled to the gate of the second transistor, and a second end. The first switch comprises a first end coupled to the second end of the first capacitor, and a second end coupled to the source of the first transistor. The second switch comprises a first end coupled to the second end of the second capacitor, and a second end coupled to the source of the second transistor. The third switch comprises a first end for receiving a first reference voltage, and a second end coupled to the first end of the first capacitor. The fourth switch comprises a first end for receiving a second reference voltage, and a second end coupled to the first end of the second capacitor. The fifth switch comprises a first end for receiving an input voltage, and a second end coupled to the second end of the first capacitor. The sixth switch comprises a first end for receiving the input voltage, and a second end coupled to the second end of the second capacitor. The third capacitor comprises a first end coupled to the gate of the first transistor, and a second end. The fourth capacitor comprises a first end coupled to the gate of the second transistor, and a second end. The seventh switch comprises a first end coupled to the first end of the fifth switch, and a second end coupled to the second end of the third capacitor. The eighth switch comprises a first end coupled to the first end of the sixth switch, and a second end coupled to the second end of the fourth capacitor. The ninth switch comprises a first end coupled to the second end of the third capacitor, and a second end coupled to the source of the first transistor. The tenth switch comprises a first end coupled to the second end of the fourth capacitor, and a second end coupled to the source of the second transistor. The analog buffer performs a voltage compensation operation for generating the output voltage based on the first reference voltage and the second reference voltage.

In accordance with another embodiment of the present invention, an analog buffer with voltage compensation mechanism is disclosed. The analog buffer comprises a first transistor, a second transistor, a first capacitor, a second capacitor, a first switch, a second switch, a third switch, a fourth switch, a fifth switch, a sixth switch, a third transistor, a fourth transistor, a seventh switch, an eighth switch, a ninth switch, and a tenth switch.

The first transistor comprises a drain for receiving a first supply voltage, a source for outputting an output voltage, and a gate. The second transistor comprises a drain for receiving a second supply voltage, a source coupled to the source of the first transistor, and a gate. The first capacitor comprises a first end coupled to the gate of the first transistor, and a second end. The second capacitor comprises a first end coupled to the gate of the second transistor, and a second end. The first switch comprises a first end coupled to the second end of the first capacitor, and a second end coupled to the source of the first transistor. The second switch comprises a first end coupled to the second end of the second capacitor, and a second end coupled to the source of the second transistor. The third switch comprises a first end for receiving a first reference voltage, and a second end coupled to the first end of the first capacitor. The fourth switch comprises a first end for receiving a second reference voltage, and a second end coupled to the first end of the second capacitor. The fifth switch comprises a first end for receiving an input voltage, and a second end coupled to the second end of the first capacitor. The sixth switch comprises a first end for receiving the input voltage, and a second end coupled to the second end of the second capacitor. The third transistor comprises a drain for receiving a third supply voltage, a source coupled to the source of the first transistor, and a gate. The fourth transistor comprises a drain for receiving a fourth supply voltage, a source coupled to the source of the second transistor, and a gate. The seventh switch comprises a first end coupled to the gate of the third transistor, and a second end coupled to the source of the third transistor. The eighth switch comprises a first end coupled to the gate of the fourth transistor, and a second end coupled to the source of the fourth transistor. The ninth switch comprises a first end coupled to the gate of the first transistor, and a second end coupled to the gate of the third transistor. The tenth switch comprises a first end coupled to the gate of the second transistor, and a second end coupled to the gate of the fourth transistor. The analog buffer performs a voltage compensation operation for generating the output voltage based on the first reference voltage and the second reference voltage.

In accordance with another embodiment of the present invention, an analog buffer with voltage compensation mechanism is disclosed. The analog buffer comprises a first transistor, a second transistor, a first capacitor, a second capacitor, a first switch, a second switch, a third switch, a fourth switch, a fifth switch, a sixth switch, a third capacitor, a fourth capacitor, a seventh switch, an eighth switch, a ninth switch, a tenth switch, a third transistor, a fourth transistor, an eleventh switch, a twelfth switch, a thirteenth switch, and a fourteenth switch.

The first transistor comprises a drain for receiving a first supply voltage, a source for outputting an output voltage, and a gate. The second transistor comprises a drain for receiving a second supply voltage, a source coupled to the source of the first transistor, and a gate. The first capacitor comprises a first end coupled to the gate of the first transistor, and a second end. The second capacitor comprises a first end coupled to the gate of the second transistor, and a second end. The first switch comprises a first end coupled to the second end of the first capacitor, and a second end coupled to the source of the first transistor. The second switch comprises a first end coupled to the second end of the second capacitor, and a second end coupled to the source of the second transistor. The third switch comprises a first end for receiving a first reference voltage, and a second end coupled to the first end of the first capacitor. The fourth switch comprises a first end for receiving a second reference voltage, and a second end coupled to the first end of the second capacitor. The fifth switch comprises a first end for receiving an input voltage, and a second end coupled to the second end of the first capacitor. The sixth switch comprises a first end for receiving the input voltage, and a second end coupled to the second end of the second capacitor. The third capacitor comprises a first end coupled to the gate of the first transistor, and a second end. The fourth capacitor comprises a first end coupled to the gate of the second transistor, and a second end. The seventh switch comprises a first end coupled to the first end of the fifth switch, and a second end coupled to the second end of the third capacitor. The eighth switch comprises a first end coupled to the first end of the sixth switch, and a second end coupled to the second end of the fourth capacitor. The ninth switch comprises a first end coupled to the second end of the third capacitor, and a second end coupled to the source of the first transistor. The tenth switch comprises a first end coupled to the second end of the fourth capacitor, and a second end coupled to the source of the second transistor. The third transistor comprises a drain for receiving a third supply voltage, a source coupled to the source of the first transistor, and a gate. The fourth transistor comprises a drain for receiving a fourth supply voltage, a source coupled to the source of the second transistor, and a gate. The eleventh switch comprises a first end coupled to the gate of the third transistor, and a second end coupled to the source of the third transistor. The twelfth switch comprises a first end coupled to the gate of the fourth transistor, and a second end coupled to the source of the fourth transistor. The thirteenth switch comprises a first end coupled to the gate of the first transistor, and a second end coupled to the gate of the third transistor. The fourteenth switch comprises a first end coupled to the gate of the second transistor, and a second end coupled to the gate of the fourth transistor. The analog buffer performs a voltage compensation operation for generating the output voltage based on the first reference voltage and the second reference voltage.

These and other objectives of the present invention will no doubt become apparent to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
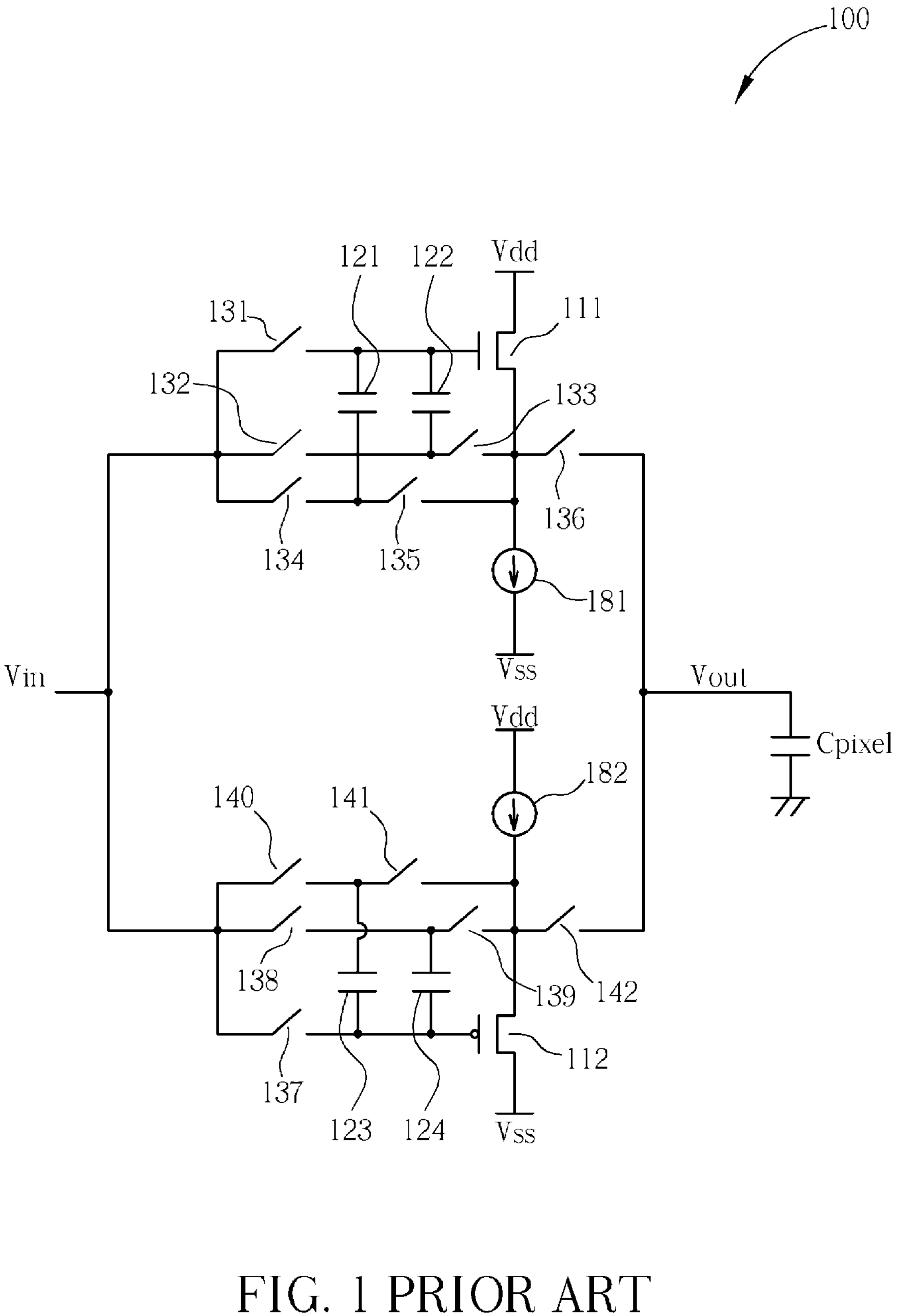
FIG. 1 PRIOR ART
FIG. 1 is a schematic diagram showing the circuit of a conventional analog buffer for use in an LCD device.
Figure 2:
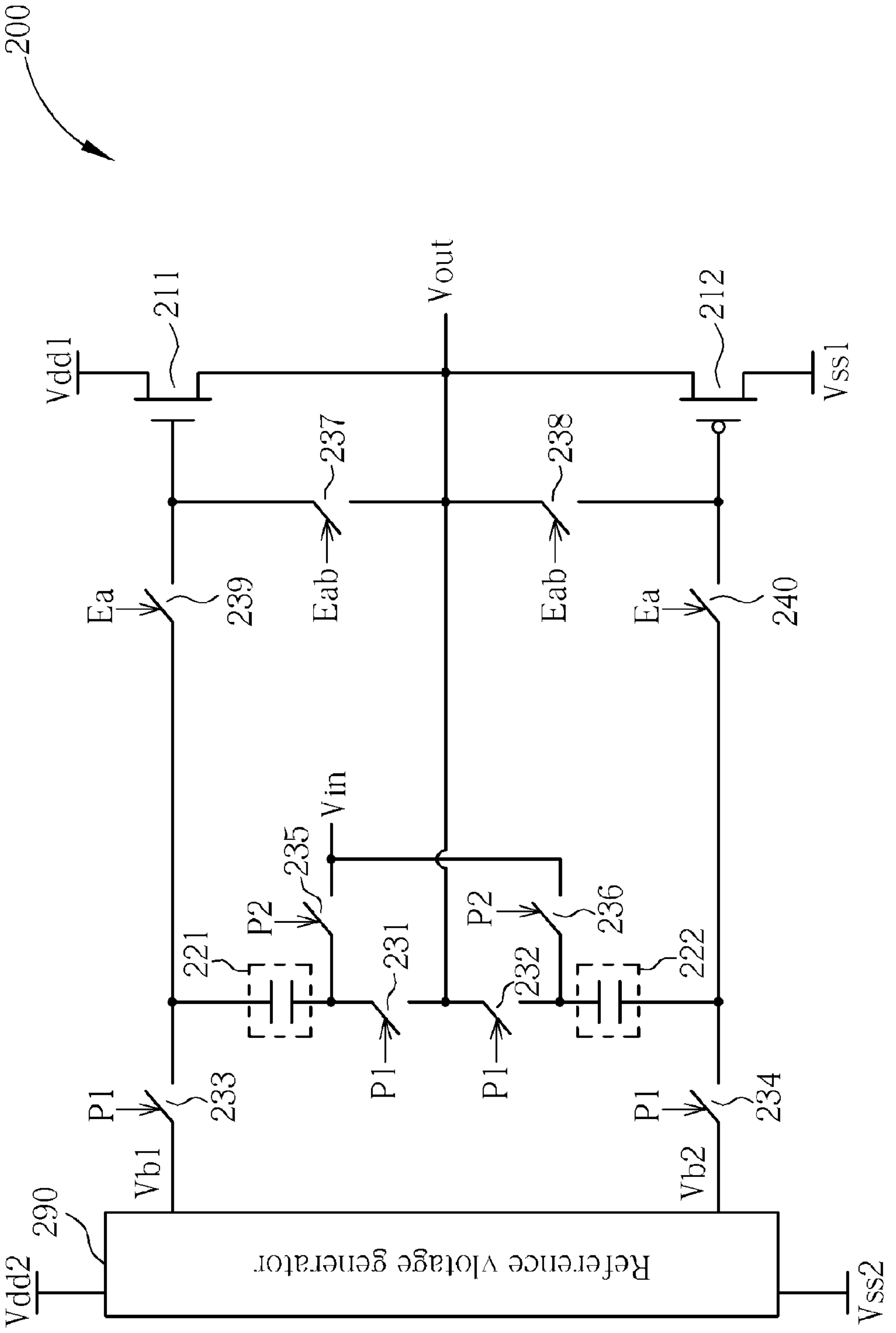
FIG. 2 is a schematic diagram showing the circuit of an analog buffer having voltage compensation mechanism in accordance with a first embodiment of the present invention.

FIG. 2 is a schematic diagram showing the circuit of an analog buffer having voltage compensation mechanism in accordance with a first embodiment of the present invention. As shown in FIG. 2, the analog buffer 200 comprises a first transistor 211, a second transistor 212, a first capacitor 221, a second capacitor 222, a first switch 231, a second switch 232, a third switch 233, a fourth switch 234, a fifth switch 235, a sixth switch 236, a seventh switch 237, an eighth switch 238, a ninth switch 239, a tenth switch 240, and a reference voltage generator 290. The reference voltage generator 290 is powered between a third supply voltage Vdd2 and a fourth supply voltage Vss2 for generating a first reference voltage Vb1 and a second reference voltage Vb2.

The first transistor 211 comprises a drain for receiving a first supply voltage Vdd1, a source for outputting an output voltage Vout, and a gate. The second transistor 212 comprises a drain for receiving a second supply voltage Vss1, a source coupled to the source of the first transistor 211, and a gate. The first transistor 211 can be an N-type MOS transistor. The second transistor 212 can be a P-type MOS transistor, and the MOS transistor may be replaced by other components have similar functions. In the circuit operation of the analog buffer 200, the first transistor 211 and the second transistor 212 are operated in the class-AB source-follower operation mode based on the common-drain configuration for lowering power consumption.

The seventh switch 237 comprises a first end and a second end respectively coupled to the gate and source of the first transistor 211. The eighth switch 238 comprises a first end and a second end respectively coupled to the gate and source of the second transistor 212. The ninth switch 239 comprises a first end and a second end. The second end of the ninth switch 239 is coupled to the gate of the first transistor 211. The tenth switch 240 comprises a first end and a second end. The second end of the tenth switch 240 is coupled to the gate of the second transistor 212. The third switch 233 comprises a first end coupled to the reference voltage generator 290 for receiving the first reference voltage Vb1, and a second end coupled to the first end of the ninth switch 239. The fourth switch 234 comprises a first end coupled to the reference voltage generator 290 for receiving the second reference voltage Vb2, and a second end coupled to the first end of the tenth switch 240.

The first capacitor 221 comprises a first end and a second end. The first end of the first capacitor 221 is coupled to the second end of the third switch 233. The second capacitor 222 comprises a first end and a second end. The first end of the second capacitor 222 is coupled to the second end of the fourth switch 234. The fifth switch 235 comprises a first end for receiving an input voltage Vin, and a second end coupled to the second end of the first capacitor 221. The sixth switch 236 comprises a first end for receiving the input voltage Vin, and a second end coupled to the second end of the second capacitor 222. The first switch 231 comprises a first end and a second end respectively coupled to the second end of the first capacitor 221 and the source of the first transistor 211. The second switch 232 comprises a first end and a second end respectively coupled to the second end of the second capacitor 222 and the source of the second transistor 212.

Figure 3:
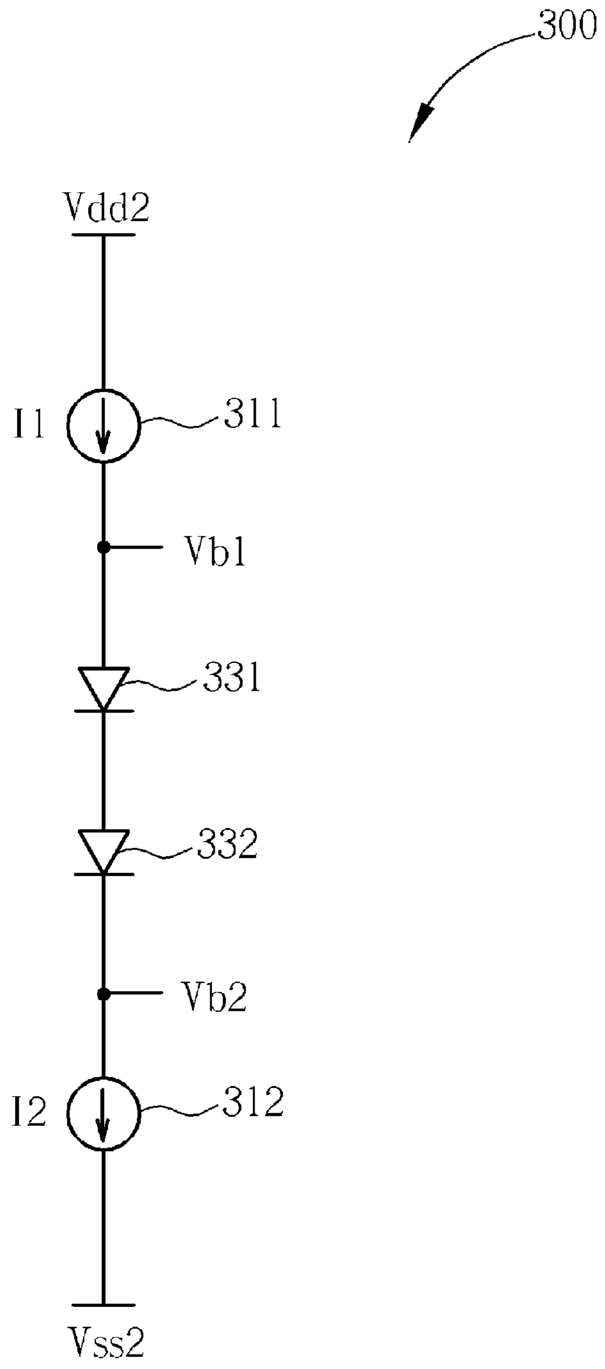
FIG. 3 is a schematic circuit diagram showing a first embodiment of the reference voltage generator.

In one embodiment, the internal circuit structure of the reference voltage generator 290 in FIG. 2 can be designed as the reference voltage generator 300 shown in FIG. 3, which is a schematic circuit diagram showing a first embodiment of the reference voltage generator. As shown in FIG. 3, the reference voltage generator 300 comprises a first current source 311, a second current source 312, a first compensation diode 331 and a second compensation diode 332. The first current source 311 comprises a first end for receiving the third supply voltage Vdd2, and a second end for providing a current 11. The second current source 312 comprises a first end for receiving the fourth supply voltage Vss2, and a second end for providing a current 12. The first compensation diode 331 comprises a positive end and a negative end. The positive end of the first compensation diode 331 is coupled to the second end of the first current source 311. The second compensation diode 332 comprises a positive end coupled to the negative end of the first compensation diode 331, and a negative end coupled to the second end of the second current source 312. The first reference voltage Vb1 and the second reference voltage Vb2 are outputted respectively from the positive end of the first compensation diode 331 and the negative end of the second compensation diode 332.

Figure 4:
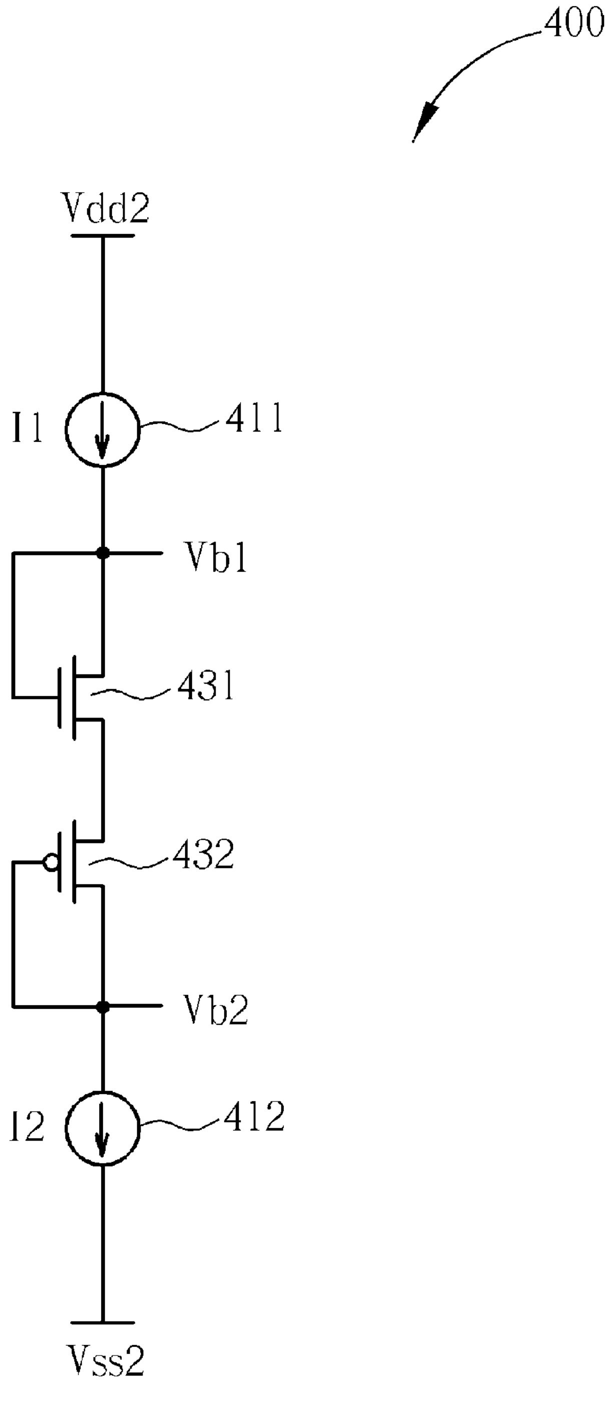
FIG. 4 is a schematic circuit diagram showing a second embodiment of the reference voltage generator.

In another embodiment, the internal circuit structure of the reference voltage generator 290 in FIG. 2 can be designed as the reference voltage generator 400 shown in FIG. 4. Please refer to FIG. 4, which is a schematic circuit diagram showing a second embodiment of the reference voltage generator. As shown in FIG. 4, the reference voltage generator 400 comprises a first current source 411, a second current source 412, a first transistor 431 and a second transistor 432. The first current source 411 comprises a first end for receiving the third supply voltage Vdd2, and a second end for providing a current 11. The second current source 412 comprises a first end for receiving the fourth supply voltage Vss2, and a second end for providing a current 12. The first transistor 431 comprises a drain coupled to the second end of the first current source 411, a gate coupled to the drain, and a source. The second transistor 432 comprises a drain coupled to the second end of the second current source 412, a gate coupled to the drain, and a source coupled to the source of the first transistor 431. The first reference voltage Vb1 and the second reference voltage Vb2 are outputted respectively from the drain of the first transistor 431 and the drain of the second transistor 432. The first transistor 431 can be an N-type MOS transistor. The second transistor 432 can be a P-type MOS transistor, and the MOS transistor may be replaced by other components having similar functions.

Figure 5:
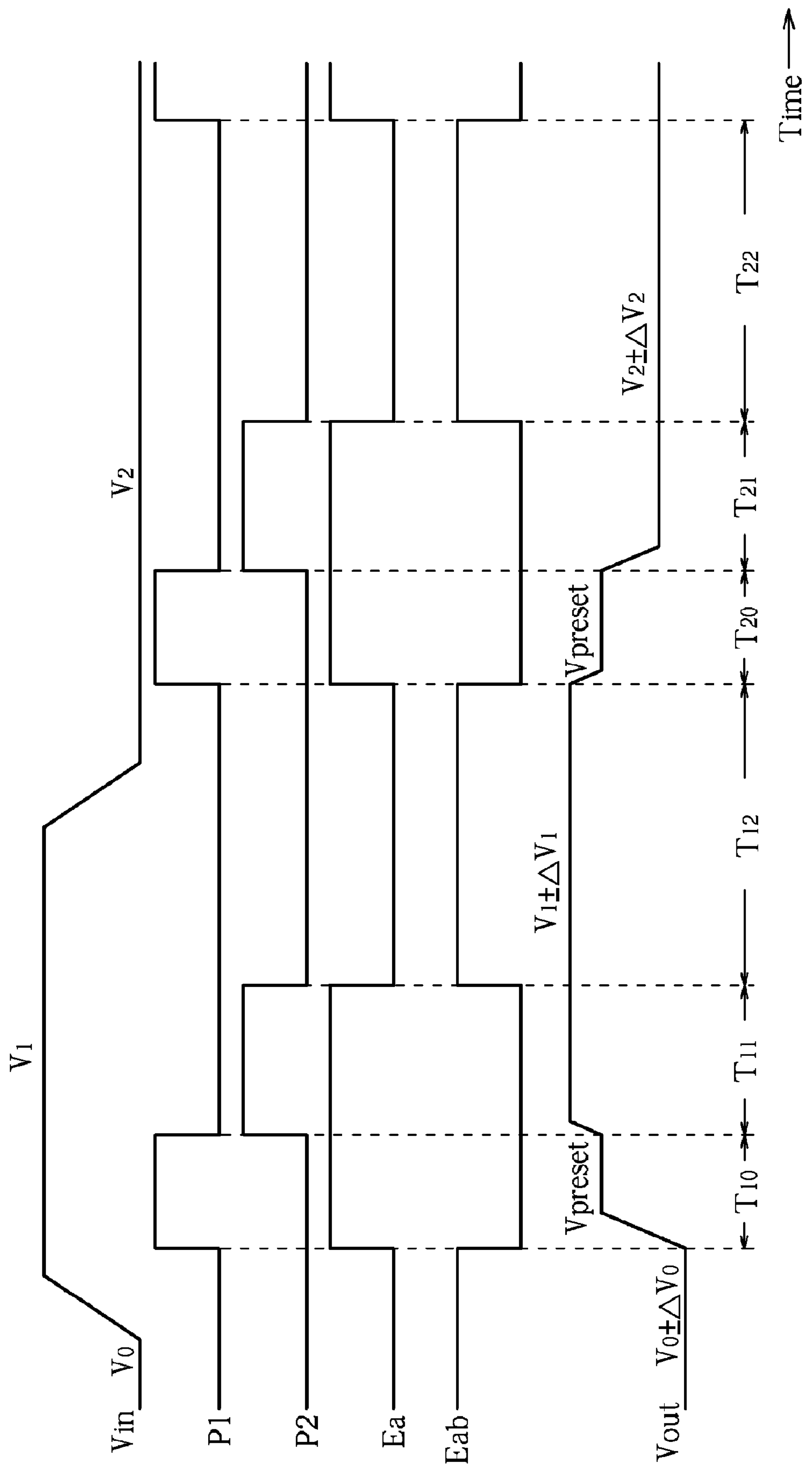
FIG. 5 shows the related signal waveforms concerning the circuit operation of the analog buffer in FIG. 2, having time along the abscissa.

FIG. 5 shows the related signal waveforms concerning the circuit operation of the analog buffer in FIG. 2, having time along the abscissa. The signal waveforms in FIG. 5, from top to bottom, are the input voltage Vin, the first control signal P1, the second control signal P2, the first enable control signal Ea, the second enable control signal Eab, and the output voltage Vout. The first switch 231 through the fourth switch 234 are turned on/off in response to the first control signal P1. The fifth switch 235 and the sixth switch 236 are turned on/off in response to the second control signal P2. The ninth switch 239 and the tenth switch 240 are turned on/off in response to the first enable control signal Ea. The seventh switch 237 and the eighth switch 238 are turned on/off in response to the second enable control signal Eab. In the following description of the circuit operation concerning the related signal waveforms in FIG. 5, the enabled signal having high voltage level is utilized for turning on corresponding switches, and the disabled signal having low voltage level is utilized for turning off corresponding switches. The circuit operation of the analog buffer 200 is detailed as the followings.

When the first control signal P1 and the first enable control signal Ea are set to be enabled signals and the second control signal P2 and the second enable control signal Eab are set to be disabled signals during the interval $T_{10}$, the output voltage Vout is changed from the previous voltage $V_0 \pm \Delta V_0$ to the preset voltage Vpreset; meanwhile, the first capacitor 221 is charged to have the capacitor voltage as the gate-source voltage of the first transistor 211 in turn-on state, and the second capacitor 222 is charged to have the capacitor voltage as the gate-source voltage of the second transistor 212 in turn-on state.

When the second control signal P2 and the first enable control signal Ea are set to be enabled signals and the first control signal P1 and the second enable control signal Eab are set to be disabled signals during the interval $T_{11}$, the output voltage Vout is changed from the preset voltage Vpreset to the voltage $V_1 \pm \Delta V_1$ based on the voltage $V_1$ of the input voltage Vin in conjunction with the capacitor voltages of the first capacitor 221 and the second capacitor 222. Since the gate-source voltages of the first transistor 211 and the second transistor 212 in turn-on state are compensated by the capacitor voltages of the first capacitor 221 and the second capacitor 222, the variation error $\Delta V_1$ can be lowered to an acceptable tiny offset with respect to the input voltage Vin.

When the second enable control signal Eab is set to be an enabled signal and the first control signal P1, the second control signal P2 and the first enable control signal Ea are set to be disabled signals during the interval $T_{12}$, the first transistor 211 and the second transistor 212 are turned off for retaining the voltage $V_1 \pm \Delta V_1$ of the output voltage Vout and for saving power consumption corresponding to the first transistor 211 and the second transistor 212.

When the first control signal P1 and the first enable control signal Ea are set to be enabled signals and the second control signal P2 and the second enable control signal Eab are set to be disabled signals during the interval $T_{20}$, the output voltage Vout is changed from the voltage $V_1 \pm \Delta V_1$ to the preset voltage Vpreset; meanwhile, the first capacitor 221 and the second capacitor 222 are charged to have the capacitor voltages respectively equal to the gate-source voltages of the first transistor 211 and the second transistor 212 in turn-on state.

When the second control signal P2 and the first enable control signal Ea are set to be enabled signals and the first control signal P1 and the second enable control signal Eab are set to be disabled signals during the interval $T_{21}$, the output voltage Vout is changed from the preset voltage Vpreset to the voltage $V_2 \pm \Delta V_2$ based on the voltage $V_2$ of the input voltage Vin in conjunction with the capacitor voltages of the first capacitor 221 and the second capacitor 222. Since the gate-source voltages of the first transistor 211 and the second capacitor 222 in turn-on state are compensated by the capacitor voltages of the first capacitor 221 and the second capacitor 222, the variation error $\Delta V_2$ can be lowered to an acceptable tiny offset with respect to the input voltage Vin.

When the second enable control signal Eab is set to be an enabled signal and the first control signal P1, the second control signal P2 and the first enable control signal Ea are set to be disabled signals during the interval $T_{22}$, the first transistor 211 and the second transistor 212 are turned off for retaining the voltage $V_2 \pm \Delta V_2$ of the output voltage Vout and for saving power consumption corresponding to the first transistor 211 and the second transistor 212.

Based on the above description, it is obvious that the seventh switch 237 through the tenth switch 240 are utilized to control on/off states of the first transistor 211 and the second transistor 212 for saving power consumption. If the design key issue of the analog buffer 200 is focused on production cost instead of power consumption, then the seventh switch 237 through the tenth switch 240 can be omitted for lowering production cost. That is, in another embodiment of the analog buffer 200, the seventh switch 237 and the eighth switch 238 are replaced with open circuits, and the ninth switch 239 and the tenth switch 240 are replaced with short circuits, which is also applied to the following embodiments. It is noted that the enable signal and the disable signal are not limited to the signals having high voltage level and low voltage level respectively. In another embodiment, the enable signal and the disable signal can be set as the signals having low voltage level and high voltage level respectively without degrading the performance of the analog buffer.

Figure 6:
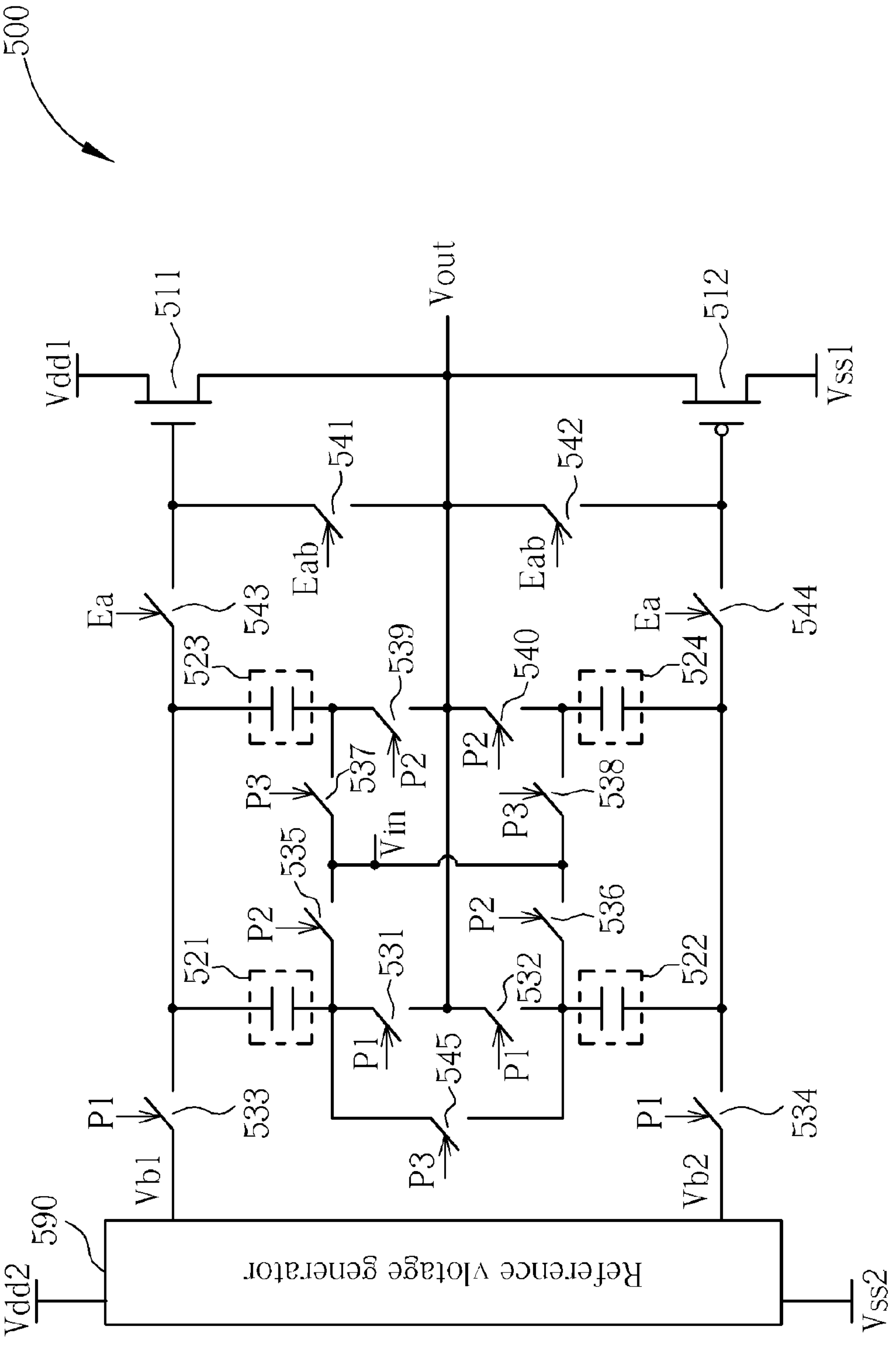
FIG. 6 is a schematic diagram showing the circuit of an analog buffer having voltage compensation mechanism in accordance with a second embodiment of the present invention.

FIG. 6 is a schematic diagram showing the circuit of an analog buffer having voltage compensation mechanism in accordance with a second embodiment of the present invention. As shown in FIG. 6, the analog buffer 500 comprises a first transistor 511, a second transistor 512, a first capacitor 521, a second capacitor 522, a third capacitor 523, a fourth capacitor 524, a first switch 531, a second switch 532, a third switch 533, a fourth switch 534, a fifth switch 535, a sixth switch 536, a seventh switch 537, an eighth switch 538, a ninth switch 539, a tenth switch 540, an eleventh switch 541, a twelfth switch 542, a thirteenth switch 543, a fourteenth switch 544, a fifteenth switch 545, and a reference voltage generator 590. The reference voltage generator 590 is powered between a third supply voltage Vdd2 and a fourth supply voltage Vss2 for generating a first reference voltage Vb1 and a second reference voltage Vb2.

The first transistor 511 comprises a drain for receiving a first supply voltage Vdd1, a source for outputting an output voltage Vout, and a gate. The second transistor 512 comprises a drain for receiving a second supply voltage Vss1, a source coupled to the source of the first transistor 511, and a gate. The first transistor 511 can be an N-type MOS transistor. The second transistor 512 can be a P-type MOS transistor. In the circuit operation of the analog buffer 500, the first transistor 511 and the second transistor 512 are operated in the class-AB source-follower operation mode based on the common-drain configuration for lowering power consumption.

The eleventh switch 541 comprises a first end and a second end respectively coupled to the gate and source of the first transistor 511. The twelfth switch 542 comprises a first end and a second end respectively coupled to the gate and source of the second transistor 512. The thirteenth switch 543 comprises a first end and a second end. The second end of the thirteenth switch 543 is coupled to the gate of the first transistor 511. The fourteenth switch 544 comprises a first end and a second end. The second end of the fourteenth switch 544 is coupled to the gate of the second transistor 512. The third capacitor 523 comprises a first end and a second end. The first end of the third capacitor 523 is coupled to the first end of the thirteenth switch 543. The fourth capacitor 524 comprises a first end and a second end. The first end of the fourth capacitor 524 is coupled to the first end of the fourteenth switch 544. The ninth switch 539 comprises a first end coupled to the second end of the third capacitor 523, and a second end coupled to the source of the first transistor 511. The tenth switch 540 comprises a first end coupled to the second end of the fourth capacitor 524, and a second end coupled to the source of the second transistor 512.

The seventh switch 537 comprises a first end for receiving an input voltage Vin, and a second end coupled to the second end of the third capacitor 523. The eighth switch 538 comprises a first end for receiving the input voltage Vin, and a second end coupled to the second end of the fourth capacitor 524. The third switch 533 comprises a first end coupled to the reference voltage generator 590 for receiving the first reference voltage Vb1, and a second end coupled to the first end of the thirteenth switch 543. The fourth switch 534 comprises a first end coupled to the reference voltage generator 590 for receiving the second reference voltage Vb2, and a second end coupled to the first end of the fourteenth switch 544.

The first capacitor 521 comprises a first end and a second end. The first end of the first capacitor 521 is coupled to the second end of the third switch 533. The second capacitor 522 comprises a first end and a second end. The first end of the second capacitor 522 is coupled to the second end of the fourth switch 534. The fifth switch 535 comprises a first end for receiving the input voltage Vin, and a second end coupled to the second end of the first capacitor 521. The sixth switch 536 comprises a first end for receiving the input voltage Vin, and a second end coupled to the second end of the second capacitor 522. The first switch 531 comprises a first end and a second end respectively coupled to the second end of the first capacitor 521 and the source of the first transistor 511. The second switch 532 comprises a first end and a second end respectively coupled to the second end of the second capacitor 522 and the source of the second transistor 512. The fifteenth switch 545 comprises a first end and a second end respectively coupled to the second end of the first capacitor 521 and the second end of the second capacitor 522.

In one embodiment, the internal circuit structure of the reference voltage generator 590 in FIG. 6 can be designed as the reference voltage generator 300 shown in FIG. 3. In another embodiment, the internal circuit structure of the reference voltage generator 590 in FIG. 6 can be designed as the reference voltage generator 400 shown in FIG. 4.

Figure 7:
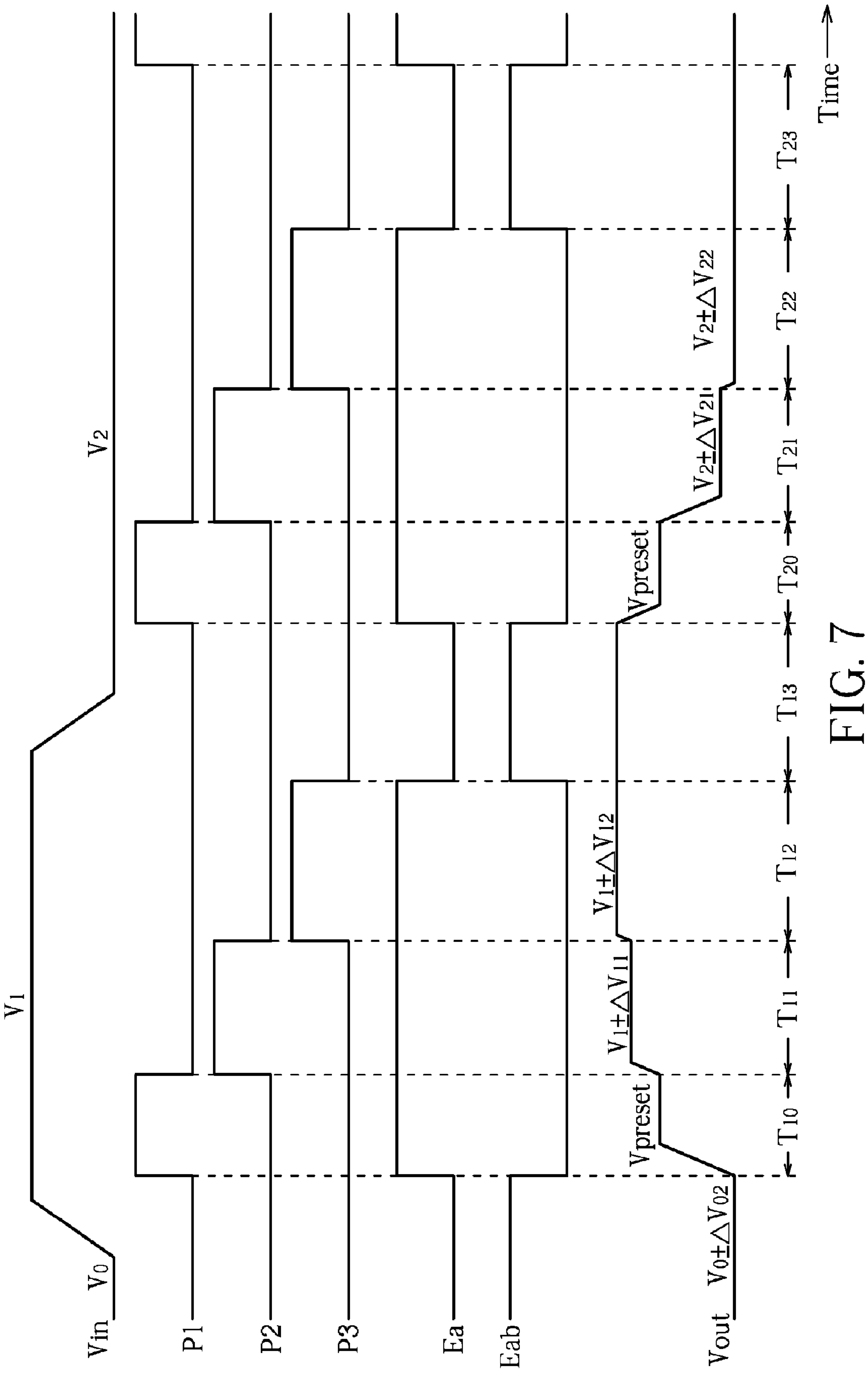
FIG. 7 shows the related signal waveforms concerning the circuit operation of the analog buffer in FIG. 6, having time along the abscissa.

FIG. 7 shows the related signal waveforms concerning the circuit operation of the analog buffer in FIG. 6, having time along the abscissa. The signal waveforms in FIG. 7, from top to bottom, are the input voltage Vin, the first control signal P1, the second control signal P2, the third control signal P3, the first enable control signal Ea, the second enable control signal Eab, and the output voltage Vout. The first switch 531 through the fourth switch 534 are turned on/off in response to the first control signal P1. The fifth switch 535, the sixth switch 536, the ninth switch 539 and the tenth switch 540 are turned on/off in response to the second control signal P2. The seventh switch 537, the eighth switch 538 and the fifteenth switch 545 are turned on/off in response to the third control signal P3. The thirteenth switch 543 and the fourteenth switch 544 are turned on/off in response to the first enable control signal Ea. The eleventh switch 541 and the twelfth switch 542 are turned on/off in response to the second enable control signal Eab. The circuit operation of the analog buffer 500 is detailed as the followings.

When the first control signal P1 and the first enable control signal Ea are set to be enabled signals and the second control signal P2, the third control signal P3 and the second enable control signal Eab are set to be disabled signals during the interval $T_{10}$, the output voltage Vout is changed from the previous voltage $V_0 \pm \Delta V_{02}$ to the preset voltage Vpreset; meanwhile, the first capacitor 521 is charged to have the capacitor voltage as the first gate-source voltage of the first transistor 511 in turn-on state, and the second capacitor 522 is charged to have the capacitor voltage as the second gate-source voltage of the second transistor 512 in turn-on state.

When the second control signal P2 and the first enable control signal Ea are set to be enabled signals and the first control signal P1, the third control signal P3 and the second enable control signal Eab are set to be disabled signals during the interval $T_{11}$, the output voltage Vout is changed from the preset voltage Vpreset to the voltage $V_1 \pm \Delta V_{11}$ based on the voltage $V_1$ of the input voltage Vin in conjunction with the capacitor voltages of the first capacitor 521 and the second capacitor 522. Since the third gate-source voltage of the first transistor 511 in turn-on state is compensated by the capacitor voltage (the first gate-source voltage) of the first capacitor 521 and the fourth gate-source voltage of the second transistor 512 in turn-on state is compensated by the capacitor voltage (the second gate-source voltage) of the second capacitor 522, the variation error is reduced to $\Delta V_{11}$. However, the third gate-source voltage and the fourth gate-source voltage are not completely compensated by the first gate-source voltage and the second gate-source voltage respectively. Consequently, the third capacitor 523 and the fourth capacitor 524 are charged to have the capacitor voltages respectively equal to the third gate-source voltage and the fourth gate-source voltage during the interval $T_{11}$ for the following compensation operation.

When the third control signal P3 and the first enable control signal Ea are set to be enabled signals and the first control signal P1, the second control signal P2 and the second enable control signal Eab are set to be disabled signals during the interval $T_{12}$, the fifteenth switch 545 is turned on for shorting the second ends of the first capacitor 521 and the second capacitor 522 so that the third capacitor 523 and the fourth capacitor 524 are capable of holding the third gate-source voltage and the fourth gate-source voltage respectively for performing accurate compensation operation. Then, the output voltage Vout is changed from the voltage $V_1 \pm \Delta V_{11}$ to the voltage $V_1 \pm \Delta V_{12}$ based on the voltage $V_1$ of the input voltage Vin in conjunction with the capacitor voltages (the third gate-source voltage and the fourth gate-source voltage) of the third capacitor 523 and the fourth capacitor 524. That is, the accurate compensation operation reduces the variation error from $\Delta V_{11}$ to $\Delta V_{12}$ for generating the output voltage Vout having an acceptable tiny offset with respect to the input voltage Vin.

When the second enable control signal Eab is set to be an enabled signal and the first control signal P1, the second control signal P2, the third control signal P3 and the first enable control signal Ea are set to be disabled signals during the interval $T_{13}$, the first transistor 511 and the second transistor 512 are turned off for retaining the voltage $V_1 \pm \Delta V_{12}$ of the output voltage Vout and for saving power consumption corresponding to the first transistor 511 and the second transistor 512. The circuit operations of the analog buffer 500 from the interval $T_{20}$ to the interval $T_{23}$ are similar to the aforementioned circuit operations from the interval $T_{10}$ to the interval $T_{13}$, and for the sake of brevity, further similar description is omitted.

Figure 8:
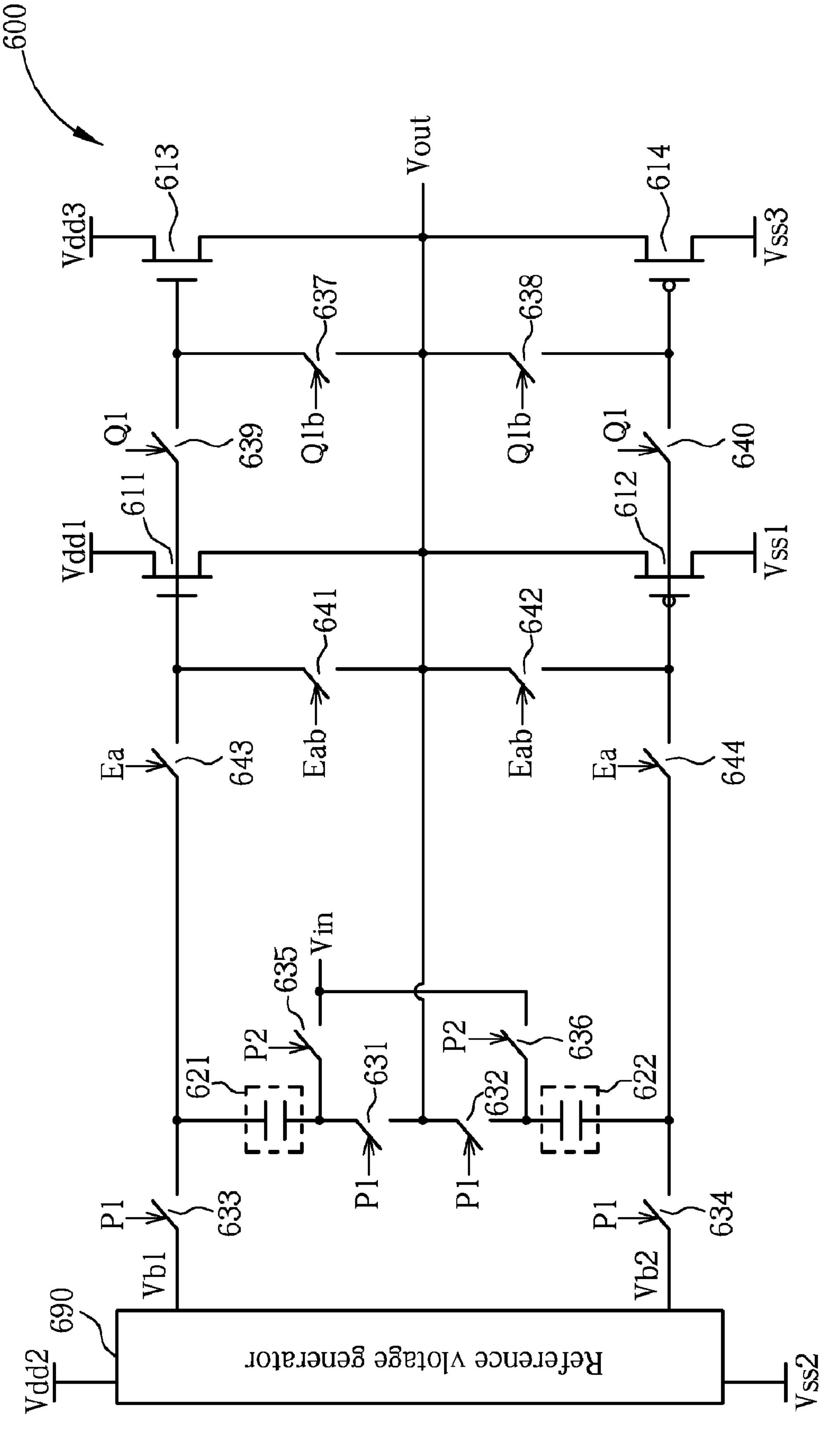
FIG. 8 is a schematic diagram showing the circuit of an analog buffer having voltage compensation mechanism in accordance with a third embodiment of the present invention.

FIG. 8 is a schematic diagram showing the circuit of an analog buffer having voltage compensation mechanism in accordance with a third embodiment of the present invention. As shown in FIG. 8, the analog buffer 600 comprises a first transistor 611, a second transistor 612, a third transistor 613, a fourth transistor 614, a first capacitor 621, a second capacitor 622, a first switch 631, a second switch 632, a third switch 633, a fourth switch 634, a fifth switch 635, a sixth switch 636, a seventh switch 637, an eighth switch 638, a ninth switch 639, a tenth switch 640, an eleventh switch 641, a twelfth switch 642, a thirteenth switch 643, a fourteenth switch 644 and a reference voltage generator 690. The reference voltage generator 690 is powered between a third supply voltage Vdd2 and a fourth supply voltage Vss2 for generating a first reference voltage Vb1 and a second reference voltage Vb2.

The first transistor 611 comprises a drain for receiving a first supply voltage Vdd1, a source for outputting an output voltage Vout, and a gate. The second transistor 612 comprises a drain for receiving a second supply voltage Vss1, a source coupled to the source of the first transistor 611, and a gate. The third transistor 613 comprises a drain for receiving a fifth supply voltage Vdd3, a source coupled to the source of the first transistor 611, and a gate. The fourth transistor 614 comprises a drain for receiving a sixth supply voltage Vss3, a source coupled to the source of the second transistor 612, and a gate. In the circuit operation of the analog buffer 600, the fifth supply voltage Vdd3 can be set to be greater than the first supply voltage Vdd1, and the sixth supply voltage Vss3 can be set to be less than the second supply voltage Vss1 for achieving high-speed voltage adjusting performance while performing auxiliary capacitor charge operations by making use of the third transistor 613 and the fourth transistor 614.

The first transistor 611 and the third transistor 613 can be N-type MOS transistors. The second transistor 612 and the fourth transistor 614 can be P-type MOS transistors. In the circuit operation of the analog buffer 600, the first transistor 611, the second transistor 612, the third transistor 613 and the fourth transistor 614 are operated in the class-AB source-follower operation mode based on the common-drain configuration for lowering power consumption.

The seventh switch 637 comprises a first end and a second end respectively coupled to the gate and source of the third transistor 613. The eighth switch 638 comprises a first end and a second end respectively coupled to the gate and source of the fourth transistor 614. The ninth switch 639 comprises a first end coupled to the gate of the first transistor 611, and a second end coupled to the gate of the third transistor 613. The tenth switch 640 comprises a first end coupled to the gate of the second transistor 612, and a second end coupled to the gate of the fourth transistor 614. The eleventh switch 641 comprises a first end and a second end respectively coupled to the gate and source of the first transistor 611. The twelfth switch 642 comprises a first end and a second end respectively coupled to the gate and source of the second transistor 612.

The thirteenth switch 643 comprises a first end and a second end. The second end of the thirteenth switch 643 is coupled to the gate of the first transistor 611. The fourteenth switch 644 comprises a first end and a second end. The second end of the fourteenth switch 644 is coupled to the gate of the second transistor 612. The third switch 633 comprises a first end coupled to the reference voltage generator 690 for receiving the first reference voltage Vb1, and a second end coupled to the first end of the thirteenth switch 643. The fourth switch 634 comprises a first end coupled to the reference voltage generator 690 for receiving the second reference voltage Vb2, and a second end coupled to the first end of the fourteenth switch 644.

The first capacitor 621 comprises a first end and a second end. The first end of the first capacitor 621 is coupled to the second end of the third switch 633. The second capacitor 622 comprises a first end and a second end. The first end of the second capacitor 622 is coupled to the second end of the fourth switch 634. The fifth switch 635 comprises a first end for receiving an input voltage Vin, and a second end coupled to the second end of the first capacitor 621. The sixth switch 636 comprises a first end for receiving the input voltage Vin, and a second end coupled to the second end of the second capacitor 622. The first switch 631 comprises a first end and a second end respectively coupled to the second end of the first capacitor 621 and the source of the first transistor 611. The second switch 632 comprises a first end and a second end respectively coupled to the second end of the second capacitor 622 and the source of the second transistor 612.

In one embodiment, the internal circuit structure of the reference voltage generator 690 in FIG. 8 can be designed as the reference voltage generator 300 shown in FIG. 3. In another embodiment, the internal circuit structure of the reference voltage generator 690 in FIG. 8 can be designed as the reference voltage generator 400 shown in FIG. 4.

Figure 9:
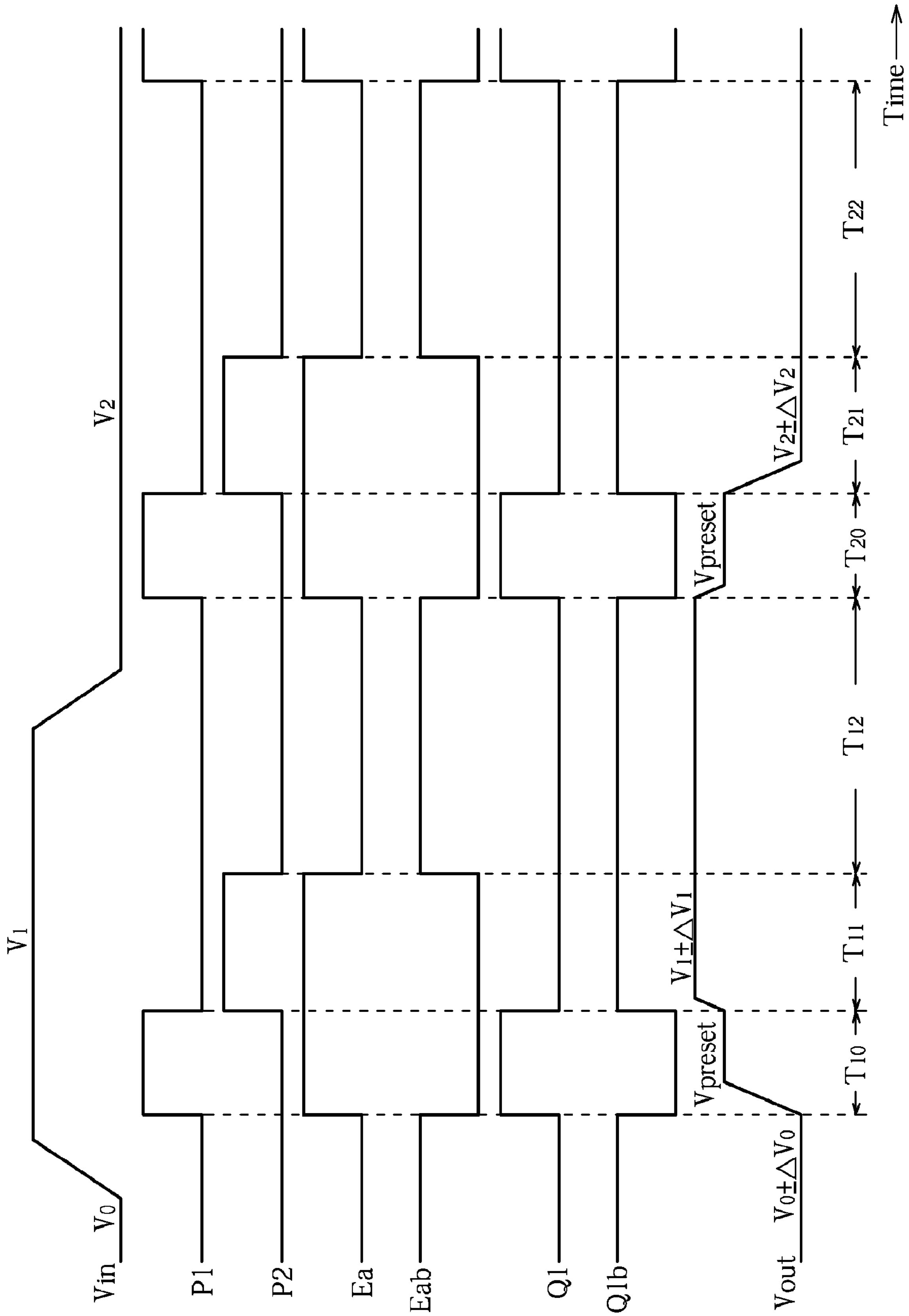
FIG. 9 shows the related signal waveforms concerning the circuit operation of the analog buffer in FIG. 8, having time along the abscissa.

FIG. 9 shows the related signal waveforms concerning the circuit operation of the analog buffer in FIG. 8, having time along the abscissa. The signal waveforms in FIG. 9, from top to bottom, are the input voltage Vin, the first control signal P1, the second control signal P2, the first enable control signal Ea, the second enable control signal Eab, the third enable control signal Q1, the fourth enable control signal Q1*b*, and the output voltage Vout. The first switch 631 through the fourth switch 634 are turned on/off in response to the first control signal P1. The fifth switch 635 and the sixth switch 636 are turned on/off in response to the second control signal P2. The thirteenth switch 643 and the fourteenth switch 644 are turned on/off in response to the first enable control signal Ea. The eleventh switch 641 and the twelfth switch 642 are turned on/off in response to the second enable control signal Eab. The ninth switch 639 and the tenth switch 640 are turned on/off in response to the third enable control signal Q1. The seventh switch 637 and the eighth switch 638 are turned on/off in response to the fourth enable control signal Q1 *b*. The circuit operation of the analog buffer 600 is detailed as the followings.

When the first control signal P1, the first enable control signal Ea and the third enable control signal Q1 are set to be enabled signals and the second control signal P2, the second enable control signal Eab and the fourth enable control signal Q1*b* are set to be disabled signals during the interval $T_{10}$, the output voltage Vout is changed from the previous voltage $V_0 \pm \Delta V_0$ to the preset voltage Vpreset; meanwhile, the first capacitor 621 is charged to have the capacitor voltage as the gate-source voltage of the first transistor 611 and the third transistor 613 in turn-on state, and the second capacitor 622 is charged to have the capacitor voltage as the gate-source voltage of the second transistor 612 and the fourth transistor 614 in turn-on state. Since the voltage adjustments of the capacitor voltages of the first capacitor 621 and the second capacitor 622 are performed via the first transistor 611 through the fourth transistor 614, the charging operations for the first capacitor 621 and the second capacitor 622 can be carried out much faster for shortening the interval $T_{10}$ so that the analog buffer 600 is able to perform analog signal buffering operations at a higher speed.

When the second control signal P2, the first enable control signal Ea and the fourth enable control signal Q1*b* are set to be enabled signals and the first control signal P1, the second enable control signal Eab and the third enable control signal Q1 are set to be disabled signals during the interval $T_{11}$, the output voltage Vout is changed from the preset voltage Vpreset to the voltage $V_1 \pm \Delta V_1$ based on the voltage $V_1$ of the input voltage Vin in conjunction with the capacitor voltages of the first capacitor 621 and the second capacitor 622. Since the gate-source voltages of the first transistor 611 through the fourth transistor 614 in turn-on state are compensated by the capacitor voltages of the first capacitor 621 and the second capacitor 622, the variation error $\Delta V_1$ can be lowered to an acceptable tiny offset with respect to the input voltage Vin.

When the second enable control signal Eab and the fourth enable control signal Q1*b* are set to be enabled signals and the first control signal P1, the second control signal P2, the first enable control signal Ea and the third enable control signal Q1 are set to be disabled signals during the interval $T_{12}$, the first transistor 611 through the fourth transistor 614 are turned off for retaining the voltage $V_1 \pm \Delta V_1$ of the output voltage Vout and for saving power consumption corresponding to the first transistor 611 through the fourth transistor 614. The circuit operations of the analog buffer 600 from the interval $T_{20}$ to the interval $T_{22}$ are similar to the aforementioned circuit operations from the interval $T_{10}$ to the interval $T_{12}$, and for the sake of brevity, further similar description is omitted.

In an alternative circuit operation of the analog buffer 600, the second control signal P2, the first enable control signal Ea and the third enable control signal Q1 are set to be enabled signals and the first control signal P1, the second enable control signal Eab and the fourth enable control signal Q1*b* are set to be disabled signals during the interval $T_{11}$ so that the analog buffer 600 is able to perform analog signal buffering operations at a much higher speed by turning on the first transistor 611 through the fourth transistor 614 for fast changing the output voltage Vout from the preset voltage Vpreset to the voltage $V_1 \pm \Delta V_1$ for shortening the interval $T_{11}$.

Figure 10:
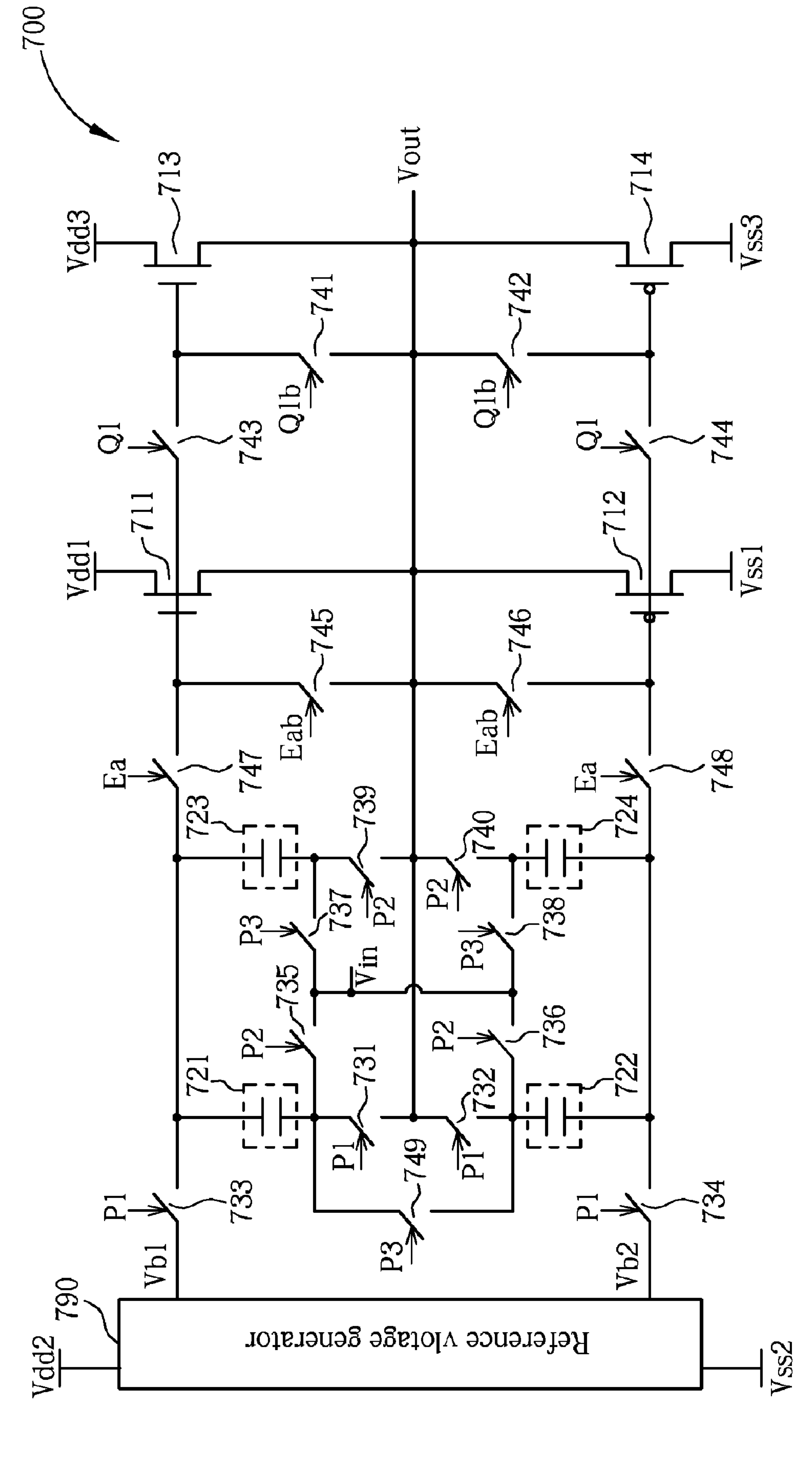
FIG. 10 is a schematic diagram showing the circuit of an analog buffer having voltage compensation mechanism in accordance with a fourth embodiment of the present invention.

FIG. 10 is a schematic diagram showing the circuit of an analog buffer having voltage compensation mechanism in accordance with a fourth embodiment of the present invention. As shown in FIG. 10, the analog buffer 700 comprises a first transistor 711, a second transistor 712, a third transistor 713, a fourth transistor 714, a first capacitor 721, a second capacitor 722, a third capacitor 723, a fourth capacitor 724, a first switch 731, a second switch 732, a third switch 733, a fourth switch 734, a fifth switch 735, a sixth switch 736, a seventh switch 737, an eighth switch 738, a ninth switch 739, a tenth switch 740, an eleventh switch 741, a twelfth switch 742, a thirteenth switch 743, a fourteenth switch 744, a fifteenth switch 745, a sixteenth switch 746, a seventeenth switch 747, an eighteenth switch 748, a nineteenth switch 749 and a reference voltage generator 790. The reference voltage generator 790 is powered between a third supply voltage Vdd2 and a fourth supply voltage Vss2 for generating a first reference voltage Vb1 and a second reference voltage Vb2.

The first transistor 711 comprises a drain for receiving a first supply voltage Vdd1, a source for outputting an output voltage Vout, and a gate. The second transistor 712 comprises a drain for receiving a second supply voltage Vss1, a source coupled to the source of the first transistor 711, and a gate. The third transistor 713 comprises a drain for receiving a fifth supply voltage Vdd3, a source coupled to the source of the first transistor 711, and a gate. The fourth transistor 714 comprises a drain for receiving a sixth supply voltage Vss3, a source coupled to the source of the second transistor 712, and a gate. Similarly, in the circuit operation of the analog buffer 700, the fifth supply voltage Vdd3 can be set to be greater than the first supply voltage Vdd1, and the sixth supply voltage Vss3 can be set to be less than the second supply voltage Vss1 for achieving high-speed voltage adjusting performance while performing auxiliary capacitor charge operations by making use of the third transistor 713 and the fourth transistor 714.

The first transistor 711 and the third transistor 713 can be N-type MOS transistors. The second transistor 712 and the fourth transistor 714 can be P-type MOS transistors. In the circuit operation of the analog buffer 700, the first transistor 711, the second transistor 712, the third transistor 713 and the fourth transistor 714 are operated in the class-AB source-follower operation mode based on the common-drain configuration for lowering power consumption.

The eleventh switch 741 comprises a first end and a second end respectively coupled to the gate and source of the third transistor 713. The twelfth switch 742 comprises a first end and a second end respectively coupled to the gate and source of the fourth transistor 714. The thirteenth switch 743 comprises a first end coupled to the gate of the first transistor 711, and a second end coupled to the gate of the third transistor 713. The fourteenth switch 744 comprises a first end coupled to the gate of the second transistor 712, and a second end coupled to the gate of the fourth transistor 714. The fifteenth switch 745 comprises a first end and a second end respectively coupled to the gate and source of the first transistor 711. The sixteenth switch 746 comprises a first end and a second end respectively coupled to the gate and source of the second transistor 712.

The seventeenth switch 747 comprises a first end and a second end. The second end of the seventeenth switch 747 is coupled to the gate of the first transistor 711. The eighteenth switch 748 comprises a first end and a second end. The second end of the eighteenth switch 748 is coupled to the gate of the second transistor 712. The third capacitor 723 comprises a first end and a second end. The first end of the third capacitor 723 is coupled to the first end of the seventeenth switch 747. The fourth capacitor 724 comprises a first end and a second end. The first end of the fourth capacitor 724 is coupled to the first end of the eighteenth switch 748. The ninth switch 739 comprises a first end coupled to the second end of the third capacitor 723, and a second end coupled to the source of the first transistor 711. The tenth switch 740 comprises a first end coupled to the second end of the fourth capacitor 724, and a second end coupled to the source of the second transistor 712.

The seventh switch 737 comprises a first end for receiving an input voltage Vin, and a second end coupled to the second end of the third capacitor 723. The eighth switch 738 comprises a first end for receiving the input voltage Vin, and a second end coupled to the second end of the fourth capacitor 724. The first capacitor 721 comprises a first end and a second end. The first end of the first capacitor 721 is coupled to the first end of the seventeenth switch 747. The second capacitor 722 comprises a first end and a second end. The first end of the second capacitor 722 is coupled to the first end of the eighteenth switch 748. The third switch 733 comprises a first end coupled to the reference voltage generator 790 for receiving the first reference voltage Vb1, and a second end coupled to the first end of the first capacitor 721. The fourth switch 734 comprises a first end coupled to the reference voltage generator 790 for receiving the second reference voltage Vb2, and a second end coupled to the first end of the second capacitor 722.

The fifth switch 735 comprises a first end for receiving the input voltage Vin, and a second end coupled to the second end of the first capacitor 721. The sixth switch 736 comprises a first end for receiving the input voltage Vin, and a second end coupled to the second end of the second capacitor 722. The first switch 731 comprises a first end and a second end respectively coupled to the second end of the first capacitor 721 and the source of the first transistor 711. The second switch 732 comprises a first end and a second end respectively coupled to the second end of the second capacitor 722 and the source of the second transistor 712. The nineteenth switch 749 comprises a first end and a second end respectively coupled to the second end of the first capacitor 721 and the second end of the second capacitor 722.

In one embodiment, the internal circuit structure of the reference voltage generator 790 in FIG. 10 can be designed as the reference voltage generator 300 shown in FIG. 3. In another embodiment, the internal circuit structure of the reference voltage generator 790 in FIG. 10 can be designed as the reference voltage generator 400 shown in FIG. 4.

Figure 11:
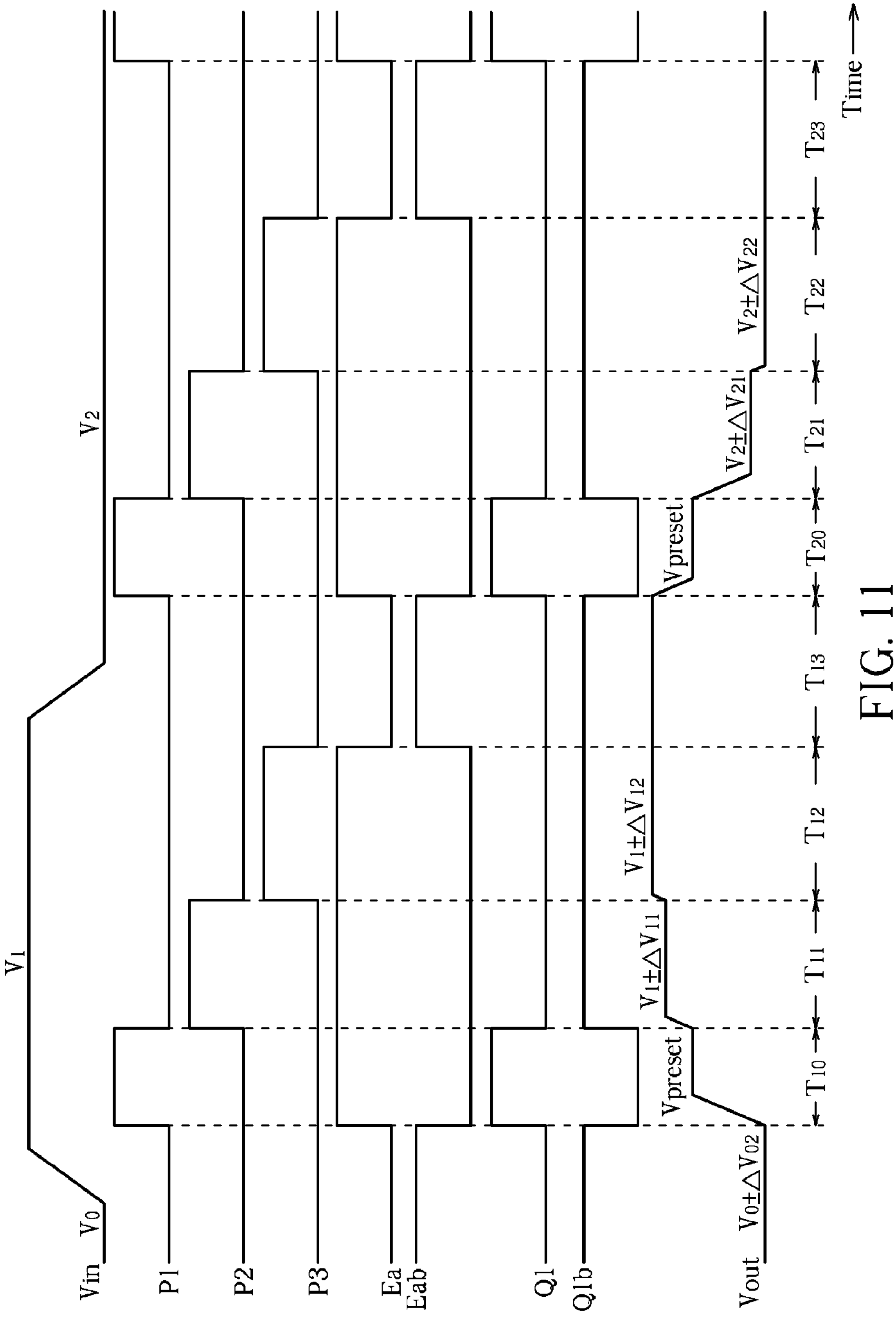
FIG. 11 shows the related signal waveforms concerning the circuit operation of the analog buffer in FIG. 10, having time along the abscissa.

FIG. 11 shows the related signal waveforms concerning the circuit operation of the analog buffer in FIG. 10, having time along the abscissa. The signal waveforms in FIG. 11, from top to bottom, are the input voltage Vin, the first control signal P1, the second control signal P2, the third control signal P3, the first enable control signal Ea, the second enable control signal Eab, the third enable control signal Q1, the fourth enable control signal Q1*b*, and the output voltage Vout. The first switch 731 through the fourth switch 734 are turned on/off in response to the first control signal P1. The fifth switch 735, the sixth switch 736, the ninth switch 739 and the tenth switch 740 are turned on/off in response to the second control signal P2. The seventh switch 737, the eighth switch 738 and the nineteenth switch 749 are turned on/off in response to the third control signal P3. The seventeenth switch 747 and the eighteenth switch 748 are turned on/off in response to the first enable control signal Ea. The fifteenth switch 745 and the sixteenth switch 746 are turned on/off in response to the second enable control signal Eab. The thirteenth switch 743 and the fourteenth switch 744 are turned on/off in response to the third enable control signal Q1. The eleventh switch 741 and the twelfth switch 742 are turned on/off in response to the fourth enable control signal Q1*b*. The circuit operation of the analog buffer 700 is detailed as the followings.

When the first control signal P1, the first enable control signal Ea and the third enable control signal Q1 are set to be enabled signals and the second control signal P2, the third control signal P3, the second enable control signal Eab and the fourth enable control signal Q1*b* are set to be disabled signals during the interval $T_{10}$, the output voltage Vout is changed from the previous voltage $V_0 \pm \Delta V_{02}$ to the preset voltage Vpreset; meanwhile, the first capacitor 721 is charged to have the capacitor voltage as the first gate-source voltage of the first transistor 711 and the third transistor 713 in turn-on state, and the second capacitor 722 is charged to have the capacitor voltage as the second gate-source voltage of the second transistor 712 and the fourth transistor 714 in turn-on state. Since the voltage adjustments of the capacitor voltages of the first capacitor 721 and the second capacitor 722 are performed via the first transistor 711 through the fourth transistor 714, the charging operations for the first capacitor 721 and the second capacitor 722 can be carried out much faster for shortening the interval $T_{10}$ so that the analog buffer 700 is able to perform analog signal buffering operations at a higher speed.

When the second control signal P2, the first enable control signal Ea and the fourth enable control signal Q1*b* are set to be enabled signals and the first control signal P1, the third control signal P3, the second enable control signal Eab and the third enable control signal Q1 are set to be disabled signals during the interval $T_{11}$, the output voltage Vout is changed from the preset voltage Vpreset to the voltage $V_1 \pm \Delta V_{11}$ based on the voltage $V_1$ of the input voltage Vin in conjunction with the capacitor voltages of the first capacitor 721 and the second capacitor 722. Since the third gate-source voltage of the first transistor 711 and the third transistor 713 in turn-on state is compensated by the capacitor voltage (the first gate-source voltage) of the first capacitor 721 and the fourth gate-source voltage of the second transistor 712 and the fourth transistor 714 in turn-on state is compensated by the capacitor voltage (the second gate-source voltage) of the second capacitor 722, the variation error is reduced to $\Delta V_{11}$. However, the third gate-source voltage and the fourth gate-source voltage are not completely compensated by the first gate-source voltage and the second gate-source voltage respectively. Consequently, the third capacitor 723 and the fourth capacitor 724 are charged to have the capacitor voltages respectively equal to the third gate-source voltage and the fourth gate-source voltage during the interval $T_{11}$ for the following compensation operation.

When the third control signal P3, the first enable control signal Ea and the fourth enable control signal Q1*b* are set to be enabled signals and the first control signal P1, the second control signal P2, the second enable control signal Eab and the third enable control signal Q1 are set to be disabled signals during the interval $T_{12}$, the nineteenth switch 749 is turned on for shorting the second ends of the first capacitor 721 and the second capacitor 722 so that the third capacitor 723 and the fourth capacitor 724 are capable of holding the third gate-source voltage and the fourth gate-source voltage respectively for performing accurate compensation operation. Then, the output voltage Vout is changed from the voltage $V_1 \pm \Delta V_{11}$ to the voltage $V_1 \pm \Delta V_{12}$ based on the voltage $V_1$ of the input voltage Vin in conjunction with the capacitor voltages (the third gate-source voltage and the fourth gate-source voltage) of the third capacitor 723 and the fourth capacitor 724. That is, the accurate compensation operation reduces the variation error from $\Delta V_{11}$ to $\Delta V_{12}$ for generating the output voltage Vout having an acceptable tiny offset with respect to the input voltage Vin.

When the second enable control signal Eab and the fourth enable control signal Q1*b* are set to be enabled signals and the first control signal P1, the second control signal P2, the third control signal P3, the first enable control signal Ea and the third enable control signal Q1 are set to be disabled signals during the interval $T_{13}$, the first transistor 711 through the fourth transistor 714 are turned off for retaining the voltage $V_1 \pm \Delta V_{12}$ of the output voltage Vout and for saving power consumption corresponding to the first transistor 711 through the fourth transistor 714. The circuit operations of the analog buffer 700 from the interval $T_{20}$ to the interval $T_{23}$ are similar to the aforementioned circuit operations from the interval $T_{10}$ to the interval $T_{13}$, and for the sake of brevity, further similar description is omitted.

In an alternative circuit operation of the analog buffer 700, the second control signal P2, the first enable control signal Ea and the third enable control signal Q1 are set to be enabled signals and the first control signal P1, the third control signal P3, the second enable control signal Eab and the fourth enable control signal Q1*b* are set to be disabled signals during the interval $T_{11}$ so that the analog buffer 700 is able to perform analog signal buffering operations at a much higher speed by turning on the first transistor 711 through the fourth transistor 714 for fast changing the output voltage Vout from the preset voltage Vpreset to the voltage $V_1 \pm \Delta V_{11}$ for shortening the interval $T_{11}$.

Furthermore, in an alternative circuit operation of the analog buffer 700, the third control signal P3, the first enable control signal Ea and the third enable control signal Q1 are set to be enabled signals and the first control signal P1, the second control signal P2, the second enable control signal Eab and the fourth enable control signal Q1*b* are set to be disabled signals during the interval $T_{12}$ so that the analog buffer 700 is able to perform analog signal buffering operations at a much higher speed by turning on the first transistor 711 through the fourth transistor 714 for fast changing the output voltage Vout from the voltage $V_1 \pm \Delta V_{11}$ to the voltage $V_1 \pm \Delta V_{12}$ for shortening the interval $T_{12}$. However, the voltage difference between the voltage $V_1 \pm \Delta V_{11}$ and the voltage $V_1 \pm \Delta V_{12}$ is substantially quite small, and therefore the reduced time of the shortened interval $T_{12}$ are quite limited, which is paid by much higher power consumption caused by the third transistor 713 and the fourth transistor 714 in turn-on state. Accordingly, in a preferred circuit operation of the analog buffer 700, the third transistor 713 and the fourth transistor 714 are turned off for saving power consumption during the interval $T_{12}$.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. An analog buffer comprising:

a first transistor comprising a drain for receiving a first supply voltage, a source for outputting an output voltage, and a gate;

a second transistor comprising a drain for receiving a second supply voltage, a source coupled to the source of the first transistor, and a gate;

a first capacitor comprising a first end coupled to the gate of the first transistor, and a second end;

a second capacitor comprising a first end coupled to the gate of the second transistor, and a second end;

a first switch comprising a first end coupled to the second end of the first capacitor, and a second end coupled to the source of the first transistor;

a second switch comprising a first end coupled to the second end of the second capacitor, and a second end coupled to the source of the second transistor;

a third switch comprising a first end for receiving a first reference voltage, and a second end coupled to the first end of the first capacitor;

a fourth switch comprising a first end for receiving a second reference voltage, and a second end coupled to the first end of the second capacitor;

a fifth switch comprising a first end for receiving an input voltage, and a second end coupled to the second end of the first capacitor;

a sixth switch comprising a first end for receiving the input voltage, and a second end coupled to the second end of the second capacitor;

a seventh switch comprising a first end coupled to the gate of the first transistor, and a second end coupled to the source of the first transistor;

an eighth switch comprising a first end coupled to the gate of the second transistor, and a second end coupled to the source of the second transistor;

a ninth switch comprising a first end coupled to the first end of the first capacitor, and a second end coupled to the gate of the first transistor; and a tenth switch comprising a first end coupled to the first end of the second capacitor, and a second end coupled to the gate of the second transistor;

wherein the analog buffer performs a voltage compensation operation for generating the output voltage based on the first reference voltage and the second reference voltage, the first, second, third and fourth switches are controlled by a first control signal, the fifth and sixth switches are controlled by a second control signal, the ninth and tenth switches are controlled by a first enable control signal, and the seventh and eighth switches are controlled by a second enable control signal.

2. The analog buffer of claim 1, further comprising:

a reference voltage generator for generating the first reference voltage and the second reference voltage, the reference voltage generator comprising:

- a first current source comprising a first end for receiving a third supply voltage, and a second end;
- a second current source comprising a first end for receiving a fourth supply voltage, and a second end;
- a first compensation diode comprising a positive end coupled to the second end of the first current source for outputting the first reference voltage, and a negative end; and
- a second compensation diode comprising a positive end coupled to the negative end of the first compensation diode, and a negative end coupled to the second end of the second current source for outputting the second reference voltage.

3. The analog buffer of claim 1, further comprising:

a reference voltage generator for generating the first reference voltage and the second reference voltage, the reference voltage generator comprising:

- a first current source comprising a first end for receiving a third supply voltage, and a second end;
- a second current source comprising a first end for receiving a fourth supply voltage, and a second end;
- an N-type MOS transistor comprising a drain coupled to the second end of the first current source for outputting the first reference voltage, a gate coupled to the drain, and a source; and
- a P-type MOS transistor comprising a drain coupled to the second end of the second current source for outputting the second reference voltage, a gate coupled to the drain, and a source coupled to the source of the N-type MOS transistor.

4. The analog buffer of claim 1, wherein the first transistor is an N-type MOS transistor and the second transistor is a P-type MOS transistor.

5. An analog buffer comprising:

a first transistor comprising a drain for receiving a first supply voltage, a source for outputting an output voltage, and a gate;

a second transistor comprising a drain for receiving a second supply voltage, a source coupled to the source of the first transistor, and a gate;

a first capacitor comprising a first end coupled to the gate of the first transistor, and a second end;

a second capacitor comprising a first end coupled to the gate of the second transistor, and a second end;

a first switch comprising a first end coupled to the second end of the first capacitor, and a second end coupled to the source of the first transistor;

a second switch comprising a first end coupled to the second end of the second capacitor, and a second end coupled to the source of the second transistor;

a third switch comprising a first end for receiving a first reference voltage, and a second end coupled to the first end of the first capacitor;

a fourth switch comprising a first end for receiving a second reference voltage, and a second end coupled to the first end of the second capacitor;

a fifth switch comprising a first end for receiving an input voltage, and a second end coupled to the second end of the first capacitor;

a sixth switch comprising a first end for receiving the input voltage, and a second end coupled to the second end of the second capacitor;

a third capacitor comprising a first end coupled to the gate of the first transistor, and a second end;

a fourth capacitor comprising a first end coupled to the gate of the second transistor, and a second end;

a seventh switch comprising a first end coupled to the first end of the fifth switch, and a second end coupled to the second end of the third capacitor;

an eighth switch comprising a first end coupled to the first end of the sixth switch, and a second end coupled to the second end of the fourth capacitor;

a ninth switch comprising a first end coupled to the second end of the third capacitor, and a second end coupled to the source of the first transistor; and a tenth switch comprising a first end coupled to the second end of the fourth capacitor, and a second end coupled to the source of the second transistor;

wherein the analog buffer performs a voltage compensation operation for generating the output voltage based on the first reference voltage and the second reference voltage.

6. The analog buffer of claim 5, further comprising:

a reference voltage generator for generating the first reference voltage and the second reference voltage, the reference voltage generator comprising:

a first current source comprising a first end for receiving a third supply voltage, and a second end;

a second current source comprising a first end for receiving a fourth supply voltage, and a second end;

a first compensation diode comprising a positive end coupled to the second end of the first current source for outputting the first reference voltage, and a negative end; and a second compensation diode comprising a positive end coupled to the negative end of the first compensation diode, and a negative end coupled to the second end of the second current source for outputting the second reference voltage.

7. The analog buffer of claim 5, further comprising:

a reference voltage generator for generating the first reference voltage and the second reference voltage, the reference voltage generator comprising:

a first current source comprising a first end for receiving a third supply voltage, and a second end;

a second current source comprising a first end for receiving a fourth supply voltage, and a second end;

an N-type MOS transistor comprising a drain coupled to the second end of the first current source for outputting the first reference voltage, a gate coupled to the drain, and a source; and a P-type MOS transistor comprising a drain coupled to the second end of the second current source for outputting the second reference voltage, a gate coupled to the drain, and a source coupled to the source of the N-type MOS transistor.

8. The analog buffer of claim 5, wherein the first transistor is an N-type MOS transistor and the second transistor is a P-type MOS transistor.

9. The analog buffer of claim 5, further comprising:

an eleventh switch comprising a first end coupled to the second end of the first capacitor, and a second end coupled to the second end of the second capacitor;

wherein the first, second, third and fourth switches are controlled by a first control signal, the fifth, sixth, ninth and tenth switches are controlled by a second control signal, and the seventh, eighth and eleventh switches are controlled by a third control signal.

10. The analog buffer of claim 5, further comprising:

an eleventh switch comprising a first end coupled to the gate of the first transistor, and a second end coupled to the source of the first transistor;

a twelfth switch comprising a first end coupled to the gate of the second transistor, and a second end coupled to the source of the second transistor;

a thirteenth switch comprising a first end coupled to the first end of the first capacitor, and a second end coupled to the gate of the first transistor; and a fourteenth switch comprising a first end coupled to the first end of the second capacitor, and a second end coupled to the gate of the second transistor;

wherein the first, second, third and fourth switches are controlled by a first control signal, the fifth, sixth, ninth and tenth switches are controlled by a second control signal, the seventh and eighth switches are controlled by a third control signal, the thirteenth and fourteenth switches are controlled by a first enable control signal, and the eleventh and twelfth switches are controlled by a second enable control signal.

11. The analog buffer of claim 10, further comprising:

a fifteenth switch comprising a first end coupled to the second end of the first capacitor, and a second end coupled to the second end of the second capacitor;

wherein the fifteenth switch is controlled by the third control signal.

12. An analog buffer comprising:

a first transistor comprising a drain for receiving a first supply voltage, a source for outputting an output voltage, and a gate;

a second transistor comprising a drain for receiving a second supply voltage, a source coupled to the source of the first transistor, and a gate;

a first capacitor comprising a first end coupled to the gate of the first transistor, and a second end;

a second capacitor comprising a first end coupled to the gate of the second transistor, and a second end;

a first switch comprising a first end coupled to the second end of the first capacitor, and a second end coupled to the source of the first transistor;

a second switch comprising a first end coupled to the second end of the second capacitor, and a second end coupled to the source of the second transistor;

a third switch comprising a first end for receiving a first reference voltage, and a second end coupled to the first end of the first capacitor;

a fourth switch comprising a first end for receiving a second reference voltage, and a second end coupled to the first end of the second capacitor;

a fifth switch comprising a first end for receiving an input voltage, and a second end coupled to the second end of the first capacitor;

a sixth switch comprising a first end for receiving the input voltage, and a second end coupled to the second end of the second capacitor;

a third transistor comprising a drain for receiving a third supply voltage, a source coupled to the source of the first transistor, and a gate;

a fourth transistor comprising a drain for receiving a fourth supply voltage, a source coupled to the source of the second transistor, and a gate;

a seventh switch comprising a first end coupled to the gate of the third transistor, and a second end coupled to the source of the third transistor;

an eighth switch comprising a first end coupled to the gate of the fourth transistor, and a second end coupled to the source of the fourth transistor;

a ninth switch comprising a first end coupled to the gate of the first transistor, and a second end coupled to the gate of the third transistor; and a tenth switch comprising a first end coupled to the gate of the second transistor, and a second end coupled to the gate of the fourth transistor;

wherein the analog buffer performs a voltage compensation operation for generating the output voltage based on the first reference voltage and the second reference voltage.

13. The analog buffer of claim 12, further comprising:

a reference voltage generator for generating the first reference voltage and the second reference voltage, the reference voltage generator comprising:

a first current source comprising a first end for receiving a fifth supply voltage, and a second end;

a second current source comprising a first end for receiving a sixth supply voltage, and a second end;

a first compensation diode comprising a positive end coupled to the second end of the first current source for outputting the first reference voltage, and a negative end; and a second compensation diode comprising a positive end coupled to the negative end of the first compensation diode, and a negative end coupled to the second end of the second current source for outputting the second reference voltage.

14. The analog buffer of claim 12, further comprising:

a reference voltage generator for generating the first reference voltage and the second reference voltage, the reference voltage generator comprising:

a first current source comprising a first end for receiving a fifth supply voltage, and a second end;

a second current source comprising a first end for receiving a sixth supply voltage, and a second end;

an N-type MOS transistor comprising a drain coupled to the second end of the first current source for outputting the first reference voltage, a gate coupled to the drain, and a source; and a P-type MOS transistor comprising a drain coupled to the second end of the second current source for outputting the second reference voltage, a gate coupled to the drain, and a source coupled to the source of the N-type MOS transistor.

15. The analog buffer of claim 12, wherein the first transistor and the third transistor are N-type MOS transistors, and the second transistor and the fourth transistor are P-type MOS transistors.

16. The analog buffer of claim 12, further comprising:

an eleventh switch comprising a first end coupled to the gate of the first transistor, and a second end coupled to the source of the first transistor;

a twelfth switch comprising a first end coupled to the gate of the second transistor, and a second end coupled to the source of the second transistor;

a thirteenth switch comprising a first end coupled to the first end of the first capacitor, and a second end coupled to the gate of the first transistor; and a fourteenth switch comprising a first end coupled to the first end of the second capacitor, and a second end coupled to the gate of the second transistor;

wherein the first, second, third and fourth switches are controlled by a first control signal, the fifth and sixth switches are controlled by a second control signal, the thirteenth and fourteenth switches are controlled by a first enable control signal, the eleventh and twelfth switches are controlled by a second enable control signal, the ninth and tenth switches are controlled by a third enable control signal, and the seventh and eighth switches are controlled by a fourth enable control signal.

17. An analog buffer comprising:

a first transistor comprising a drain for receiving a first supply voltage, a source for outputting an output voltage, and a gate;

a second transistor comprising a drain for receiving a second supply voltage, a source coupled to the source of the first transistor, and a gate;

a first capacitor comprising a first end coupled to the gate of the first transistor, and a second end;

a second capacitor comprising a first end coupled to the gate of the second transistor, and a second end;

a first switch comprising a first end coupled to the second end of the first capacitor, and a second end coupled to the source of the first transistor;

a second switch comprising a first end coupled to the second end of the second capacitor, and a second end coupled to the source of the second transistor;

a third switch comprising a first end for receiving a first reference voltage, and a second end coupled to the first end of the first capacitor;

a fourth switch comprising a first end for receiving a second reference voltage, and a second end coupled to the first end of the second capacitor;

a fifth switch comprising a first end for receiving an input voltage, and a second end coupled to the second end of the first capacitor;

a sixth switch comprising a first end for receiving the input voltage, and a second end coupled to the second end of the second capacitor;

a third capacitor comprising a first end coupled to the gate of the first transistor, and a second end;

a fourth capacitor comprising a first end coupled to the gate of the second transistor, and a second end;

a seventh switch comprising a first end coupled to the first end of the fifth switch, and a second end coupled to the second end of the third capacitor;

an eighth switch comprising a first end coupled to the first end of the sixth switch, and a second end coupled to the second end of the fourth capacitor;

a ninth switch comprising a first end coupled to the second end of the third capacitor, and a second end coupled to the source of the first transistor;

a tenth switch comprising a first end coupled to the second end of the fourth capacitor, and a second end coupled to the source of the second transistor;

a third transistor comprising a drain for receiving a third supply voltage, a source coupled to the source of the first transistor, and a gate;

a fourth transistor comprising a drain for receiving a fourth supply voltage, a source coupled to the source of the second transistor, and a gate;

an eleventh switch comprising a first end coupled to the gate of the third transistor, and a second end coupled to the source of the third transistor;

a twelfth switch comprising a first end coupled to the gate of the fourth transistor, and a second end coupled to the source of the fourth transistor;

a thirteenth switch comprising a first end coupled to the gate of the first transistor, and a second end coupled to the gate of the third transistor; and a fourteenth switch comprising a first end coupled to the gate of the second transistor, and a second end coupled to the gate of the fourth transistor;

wherein the analog buffer performs a voltage compensation operation for generating the output voltage based on the first reference voltage and the second reference voltage.

18. The analog buffer of claim 17, further comprising:

a reference voltage generator for generating the first reference voltage and the second reference voltage, the reference voltage generator comprising:

a first current source comprising a first end for receiving a fifth supply voltage, and a second end;

a second current source comprising a first end for receiving a sixth supply voltage, and a second end;

a first compensation diode comprising a positive end coupled to the second end of the first current source for outputting the first reference voltage, and a negative end; and a second compensation diode comprising a positive end coupled to the negative end of the first compensation diode, and a negative end coupled to the second end of the second current source for outputting the second reference voltage.

19. The analog buffer of claim 17, further comprising:

a reference voltage generator for generating the first reference voltage and the second reference voltage, the reference voltage generator comprising:

a first current source comprising a first end for receiving a fifth supply voltage, and a second end;

a second current source comprising a first end for receiving a sixth supply voltage, and a second end;

an N-type MOS transistor comprising a drain coupled to the second end of the first current source for outputting the first reference voltage, a gate coupled to the drain, and a source; and a P-type MOS transistor comprising a drain coupled to the second end of the second current source for outputting the second reference voltage, a gate coupled to the drain, and a source coupled to the source of the N-type MOS transistor.

20. The analog buffer of claim 17, wherein the first transistor and the third transistor are N-type MOS transistors, and the second transistor and the fourth transistor are P-type MOS transistors.

21. The analog buffer of claim 17, further comprising:

a fifteenth switch comprising a first end coupled to the second end of the first capacitor, and a second end coupled to the second end of the second capacitor;

wherein the first, second, third and fourth switches are controlled by a first control signal, the fifth, sixth, ninth and tenth switches are controlled by a second control signal, and the seventh, eighth and fifteenth switches are controlled by a third control signal, the thirteenth and fourteenth switches are controlled by a third enable control signal, and the eleventh and twelfth switches are controlled by a fourth enable control signal.

22. The analog buffer of claim 17, further comprising:

a fifteenth switch comprising a first end coupled to the gate of the first transistor, and a second end coupled to the source of the first transistor;

a sixteenth switch comprising a first end coupled to the gate of the second transistor, and a second end coupled to the source of the second transistor;

a seventeenth switch comprising a first end coupled to the first end of the first capacitor, and a second end coupled to the gate of the first transistor; and an eighteenth switch comprising a first end coupled to the first end of the second capacitor, and a second end coupled to the gate of the second transistor;

wherein the first, second, third and fourth switches are controlled by a first control signal, the fifth, sixth, ninth and tenth switches are controlled by a second control signal, the seventh and eighth switches are controlled by a third control signal, the seventeenth and eighteenth switches are controlled by a first enable control signal, the fifteenth and sixteenth switches are controlled by a second enable control signal, the thirteenth and fourteenth switches are controlled by a third enable control signal, and the eleventh and twelfth switches are controlled by a fourth enable control signal.

23. The analog buffer of claim 22, further comprising:

a nineteenth switch comprising a first end coupled to the second end of the first capacitor, and a second end coupled to the second end of the second capacitor;

wherein the nineteenth switch is controlled by the third control signal.

24. An analog buffer comprising:

a first transistor comprising a drain for receiving a first supply voltage, a source for outputting an output voltage, and a gate;

a second transistor comprising a drain for receiving a second supply voltage, a source coupled to the source of the first transistor, and a gate;

a first capacitor comprising a first end coupled to the gate of the first transistor, and a second end;

a second capacitor comprising a first end coupled to the gate of the second transistor, and a second end;

a first switch comprising a first end coupled to the second end of the first capacitor, and a second end coupled to the source of the first transistor;

a second switch comprising a first end coupled to the second end of the second capacitor, and a second end coupled to the source of the second transistor;

a third switch comprising a first end for receiving a first reference voltage, and a second end coupled to the first end of the first capacitor;

a fourth switch comprising a first end for receiving a second reference voltage, and a second end coupled to the first end of the second capacitor;

a fifth switch comprising a first end for receiving an input voltage, and a second end coupled to the second end of the first capacitor;

a sixth switch comprising a first end for receiving the input voltage, and a second end coupled to the second end of the second capacitor; and a reference voltage generator for generating the first reference voltage and the second reference voltage, the reference voltage generator comprising:

a first current source comprising a first end for receiving a third supply voltage, and a second end;

a second current source comprising a first end for receiving a fourth supply voltage, and a second end;

a first compensation diode comprising a positive end coupled to the second end of the first current source for outputting the first reference voltage, and a negative end; and a second compensation diode comprising a positive end coupled to the negative end of the first compensation diode, and a negative end coupled to the second end of the second current source for outputting the second reference voltage;

wherein the analog buffer performs a voltage compensation operation for generating the output voltage based on the first reference voltage and the second reference voltage.

25. An analog buffer comprising:

a first transistor comprising a drain for receiving a first supply voltage, a source for outputting an output voltage, and a gate;

a second transistor comprising a drain for receiving a second supply voltage, a source coupled to the source of the first transistor, and a gate;

a first capacitor comprising a first end coupled to the gate of the first transistor, and a second end;

a second capacitor comprising a first end coupled to the gate of the second transistor, and a second end;

a first switch comprising a first end coupled to the second end of the first capacitor, and a second end coupled to the source of the first transistor;

a second switch comprising a first end coupled to the second end of the second capacitor, and a second end coupled to the source of the second transistor;

a third switch comprising a first end for receiving a first reference voltage, and a second end coupled to the first end of the first capacitor;

a fourth switch comprising a first end for receiving a second reference voltage, and a second end coupled to the first end of the second capacitor;

a fifth switch comprising a first end for receiving an input voltage, and a second end coupled to the second end of the first capacitor;

a sixth switch comprising a first end for receiving the input voltage, and a second end coupled to the second end of the second capacitor; and a reference voltage generator for generating the first reference voltage and the second reference voltage, the reference voltage generator comprising:

a first current source comprising a first end for receiving a third supply voltage, and a second end;

a second current source comprising a first end for receiving a fourth supply voltage, and a second end;

an N-type MOS transistor comprising a drain coupled to the second end of the first current source for outputting the first reference voltage, a gate coupled to the drain, and a source; and a P-type MOS transistor comprising a drain coupled to the second end of the second current source for outputting the second reference voltage, a gate coupled to the drain, and a source coupled to the source of the N-type MOS transistor;

wherein the analog buffer performs a voltage compensation operation for generating the output voltage based on the first reference voltage and the second reference voltage.

* * * * *